(12) United States Patent
Haraguchi

(10) Patent No.: US 12,262,497 B2
(45) Date of Patent: Mar. 25, 2025

(54) CIRCUIT STRUCTURE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 176 days.

(21) Appl. No.: 18/002,756

(22) PCT Filed: Jun. 11, 2021

(86) PCT No.: PCT/JP2021/022284
§ 371 (c)(1),
(2) Date: Dec. 21, 2022

(87) PCT Pub. No.: WO2022/004332
PCT Pub. Date: Jan. 6, 2022

(65) Prior Publication Data
US 2023/0247788 A1 Aug. 3, 2023

(30) Foreign Application Priority Data
Jul. 1, 2020 (JP) .................................. 2020-114250

(51) Int. Cl.
*H02G 3/16* (2006.01)
*H05K 1/14* (2006.01)
(Continued)

(52) U.S. Cl.
CPC ................. *H05K 7/06* (2013.01); *H05K 1/14* (2013.01); *H05K 1/18* (2013.01); *H05K 3/44* (2013.01);
(Continued)

(58) Field of Classification Search
CPC ...... H02G 3/16; H05K 1/0265; H05K 1/0271; H05K 1/14; H05K 1/142; H05K 1/18;
(Continued)

(56) References Cited

U.S. PATENT DOCUMENTS 4,866,217 A * 9/1989 Muramatsu .......... H05K 3/4092
174/72 B
2015/0287670 A1 10/2015 Fukase et al.
(Continued)

FOREIGN PATENT DOCUMENTS

CN 204216771 U * 3/2015 .............. H02M 1/00
CN 110446333 A 11/2019
(Continued)

OTHER PUBLICATIONS

International Search Report, Application No. PCT/JP2021/022284, mailed Aug. 24, 2021. ISA/Japan Patent Office.

*Primary Examiner* — Timothy J Thompson
*Assistant Examiner* — Guillermo J Egoavil
(74) *Attorney, Agent, or Firm* — Honigman LLP

(57) ABSTRACT

A circuit structure includes a first busbar, a second busbar, an insulating member including an insulating portion located between the first busbar and the second busbar, a first wiring board provided on one main surface of the first busbar, one main surface of the second busbar and the insulating portion, and a first electronic component provided on the first wiring board. The first electronic component has a first connection terminal electrically connected to the first busbar and bonded to the first wiring board, and a second connection
(Continued)

terminal electrically connected to the second busbar and bonded to the first wiring board.

16 Claims, 23 Drawing Sheets

(51) Int. Cl.
  *H05K 1/18* (2006.01)
  *H05K 3/44* (2006.01)
  *H05K 7/06* (2006.01)
  *H05K 7/20* (2006.01)
(52) U.S. Cl.
  CPC ............ *H05K 7/2039* (2013.01); *H02G 3/16* (2013.01); *H05K 2201/09372* (2013.01); *H05K 2201/095* (2013.01); *H05K 2201/10166* (2013.01); *H05K 2201/10272* (2013.01)
(58) Field of Classification Search
  CPC ..... H05K 2201/0376; H05K 2201/068; H05K 2201/09372; H05K 2201/095; H05K 2201/10166; H05K 2201/10272; H05K 2203/1327; H05K 2203/167; H05K 3/44; H05K 7/06; H05K 7/2039; H05K 7/20

USPC ......................................................... 174/261
See application file for complete search history.

(56) References Cited

U.S. PATENT DOCUMENTS

| | | |
|---|---|---|
| 2016/0223594 A1 | 8/2016 | Suzuki et al. |
| 2017/0202088 A1 | 7/2017 | Nakamura |
| 2018/0326924 A1 | 11/2018 | Haraguchi |
| 2019/0082537 A1 | 3/2019 | Ozaki |
| 2022/0095493 A1* | 3/2022 | Blanchard St-Jacques ................ H05K 1/0231 |
| 2022/0201845 A1* | 6/2022 | Prasad .................... H05K 1/181 |

FOREIGN PATENT DOCUMENTS

| | | | | |
|---|---|---|---|---|
| DE | 102013112281 A1 | * | 5/2015 | ............ H02M 7/003 |
| JP | H9-321395 A | | 12/1997 | |
| JP | 2011172356 A | * | 9/2011 | ............... H02G 3/16 |
| JP | 2020-022273 A | | 2/2020 | |
| WO | WO-2014206693 A1 | * | 12/2014 | ............ H02M 7/003 |
| WO | WO-2021187156 A1 | * | 9/2021 | ............ H01R 11/01 |

* cited by examiner

CIRCUIT STRUCTURE

CROSS-REFERENCE TO RELATED APPLICATIONS

This application is the U.S. national stage of PCT/JP2021/022284 filed on Jun. 11, 2021, which claims priority of Japanese Patent Application No. JP 2020-114250 filed on Jul. 1, 2020, the contents of which are incorporated herein.

TECHNICAL FIELD

The present disclosure relates to a circuit structure.

BACKGROUND

JP H9-321395A discloses a heat dissipation board on which electronic components are installed.

There are configurations in which an insulating member is disposed between a plurality of busbars, and an electronic component is provided on the plurality of busbars so as to straddle the insulating member. Also, connection terminals of the electronic component may be bonded to the busbars. On the other hand, the coefficient of linear expansion of the busbars may differ from the coefficient of linear expansion of the insulating member such as a resin. When the busbars and the insulating member deform in response to changes in ambient temperature, thermal stress thus occurs in the bonding portions of the connection terminals of the electronic component and the busbars, and cracks could possibly occur in the bonding portions. As a result, the reliability of the bonding portions could possibly decrease. This problem becomes more pronounced in the case where the package of the electronic component is a leadless package.

In view of this, an object is to provide a technology capable of improving the reliability of the bonding portion of a connection terminal of an electronic component.

SUMMARY

A circuit structure of the present disclosure includes a first busbar, a second busbar, an insulating member including an insulating portion located between the first busbar and the second busbar, a first wiring board provided on one main surface of the first busbar, one main surface of the second busbar and the insulating portion, and a first electronic component provided on the first wiring board, the electronic component having a first connection terminal electrically connected to the first busbar and bonded to the first wiring board and a second connection terminal electrically connected to the second busbar and bonded to the first wiring board.

Advantageous Effects

According to the present disclosure, the reliability of the bonding portion of a connection terminal of an electronic component can be improved.

DETAILED DESCRIPTION OF PREFERRED EMBODIMENTS

Figure 1:
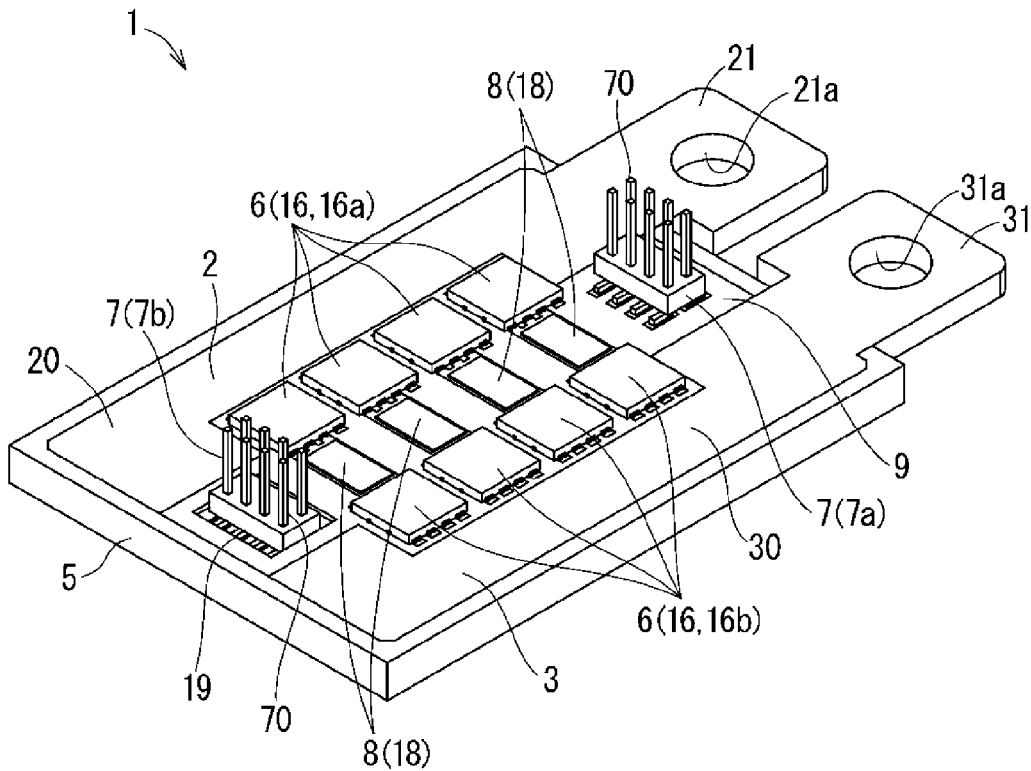
FIG. 1 is a schematic perspective view showing an example of a circuit structure.

Initially, modes of the present disclosure will be enumerated and described.

A circuit structure of the present disclosure is as follows.

A circuit structure including a first busbar, a second busbar, an insulating member including an insulating portion located between the first busbar and the second busbar, a first wiring board provided on one main surface of the first busbar, one main surface of the second busbar and the insulating portion, and a first electronic component provided on the first wiring board, the electronic component having a first connection terminal electrically connected to the first busbar and bonded to the first wiring board and a second connection terminal electrically connected to the second busbar and bonded to the first wiring board. According to this disclosure, the first connection terminal electrically connected to the first busbar and the second connection terminal electrically connected to the second busbar are both bonded to the first wiring board. Even if the first busbar, the second busbar and the insulating portion therebetween deform due to changes in ambient temperature, the bonding portions of the first connection terminal and the second connection terminal are thereby less likely to be affected by deformation of the first busbar, the second busbar and the insulating portion. Therefore, stress is less likely to occur in the bonding portions of the first connection terminal and the second connection terminal. As a result, the reliability of the bonding portions of the connection terminals of the electronic component can be improved.

The first wiring board may have a first open hole, the circuit structure may include a conductive first raised part protruding from the first busbar into the first open hole, and the first connection terminal may be electrically connected to the first raised part protruding inside the first open hole. In this case, the conductive first raised part protrudes from the first busbar into the first open hole in the first wiring board. The first connection terminal on the first wiring board can thus be easily electrically connected to the first busbar, by electrically connecting the first connection terminal to the first raised part protruding inside the first open hole.

The first raised part may be constituted by part of the first busbar. In this case, electrical resistance between the first connection terminal and the first busbar can be reduced.

The first connection terminal may be bonded to the first raised part. In this case, electrical resistance between the first connection terminal and the first busbar can be reduced.

The first wiring board may have a second open hole, the circuit structure may include a conductive second raised part protruding from the second busbar into the second open hole, the second connection terminal may be electrically connected to the second raised part protruding inside the second open hole. In this case, the conductive second raised part protrudes from the second busbar into the second open hole in the first wiring board. The second connection terminal on the first wiring board can thus be easily electrically connected to the second busbar, by electrically connecting the second connection terminal to the second raised part protruding inside the second open hole.

The first wiring board may have a land to which the second connection terminal is bonded, and a conductive extension region extending from the land and located around the second open hole, and the circuit structure may further include a conductive piece bonded to an end face of the second raised part protruding inside the second open hole and to the extension region. In this case, the conductive piece bonded to the extension region extending from the land to which the second connection terminal is bonded and located around the second open hole and to the end face of the second raised part protruding inside the second open hole is provided. Due to this conductive piece, electrical resistance between the second connection terminal and the second busbar can be reduced. Also, given that transfer of heat generated by the first electronic component to the second busbar is facilitated by the conductive piece, local increases in temperature are less likely to occur.

The circuit structure may include a second wiring board provided on another main surface of the first busbar, another main surface of the second busbar and the insulating portion, and a second electronic component provided on the second wiring board, and the second electronic component may have a third connection terminal electrically connected to the first busbar and bonded to the second wiring board, and a fourth connection terminal electrically connected to the second busbar and bonded to the second wiring board. In this case, the third connection terminal electrically connected to the first busbar and the fourth connection terminal electrically connected to the second busbar are both bonded to the second wiring board. Even if the first busbar, the second busbar and the insulating portion therebetween deform due to changes in ambient temperature, the bonding portions of the third connection terminal and the fourth connection terminal are thereby less likely to be affected by deformation of the first busbar, the second busbar and the insulating portion. Therefore, stress is less likely to occur in the bonding portions of the third connection terminal and the fourth connection terminal. Furthermore, given that the electronic components are located on both main surfaces of the busbars, the plane size of the circuit structure can be reduced.

The circuit structure may further include a heat dissipation member provided on the other main surface of the first busbar while avoiding a region where the second wiring board is provided. In this case, given that the heat dissipation member is provided on the other main surface of the first busbar while avoiding the region where the second wiring board is provided, the thickness of the circuit structure can be suppressed while improving heat dissipation of the circuit structure.

Specific examples of a circuit structure of the present disclosure will be described below with reference to the drawings. Note that the disclosure is not limited to these illustrative examples and is defined by the claims, and all changes that come within the meaning and range of equivalency of the claims are intended to be embraced therein.

Outline of Circuit Structure

Figure 2:
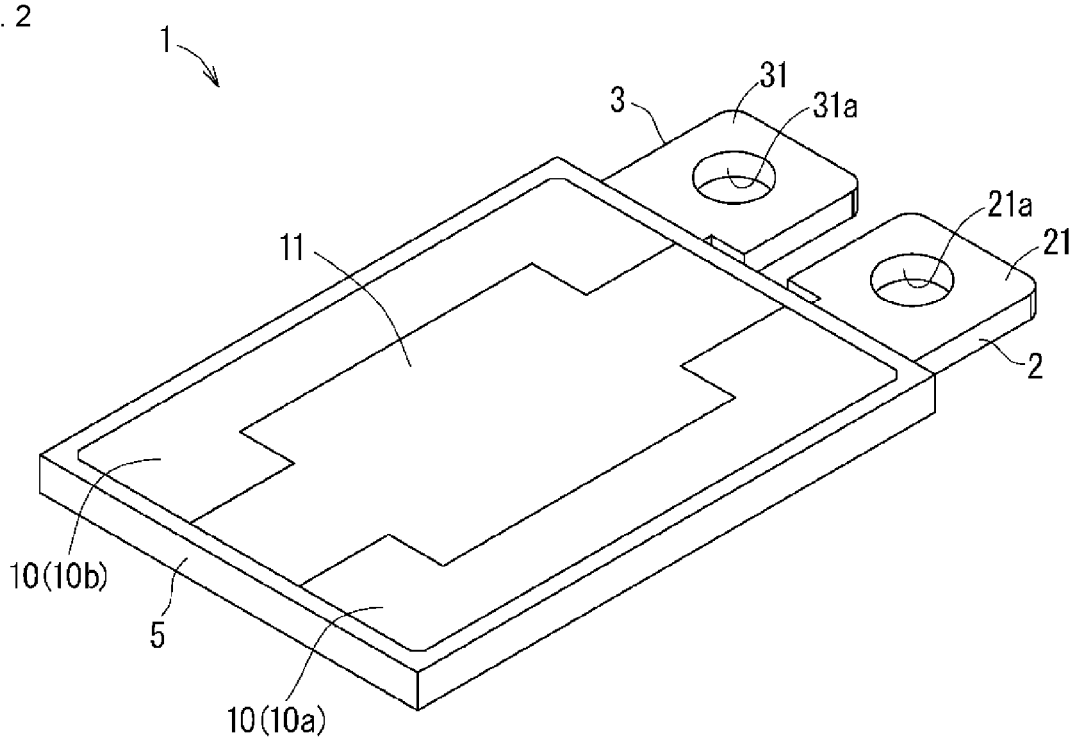
FIG. 2 is a schematic perspective view showing an example of the circuit structure.
Figure 3:
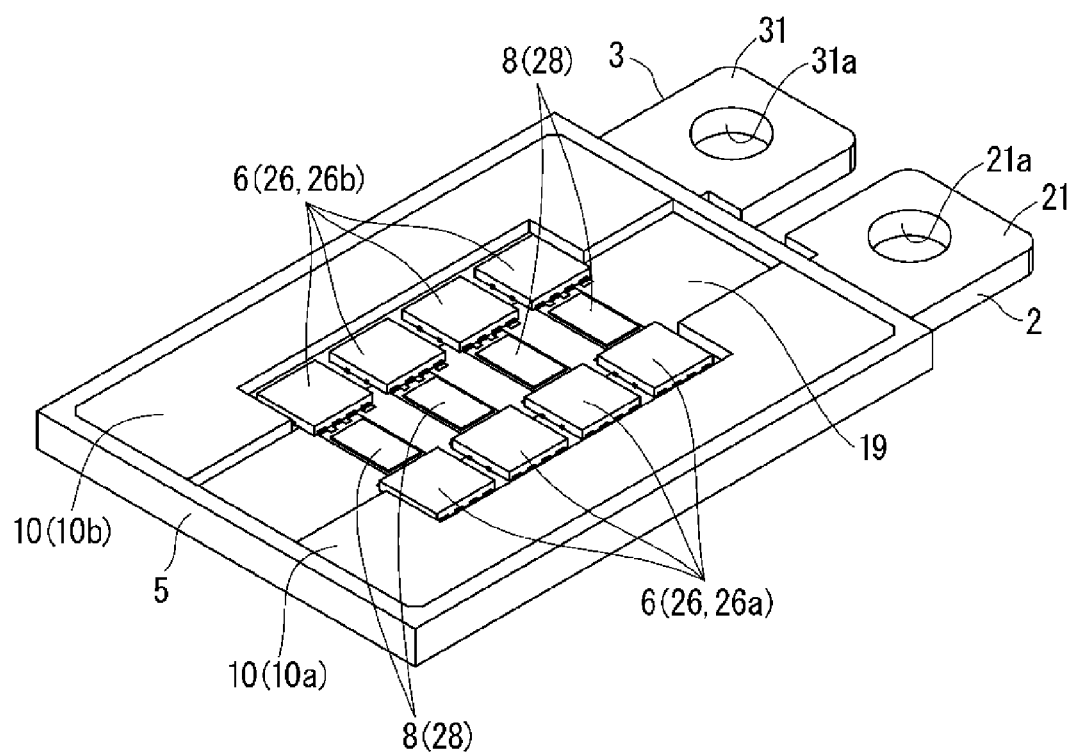
FIG. 3 is a schematic perspective view showing an example of the configuration of part of the circuit structure.

FIGS. 1 and 2 are schematic perspective views showing an example of a circuit structure 1. FIG. 2 shows the circuit structure 1 viewed from the opposite side to FIG. 1. FIG. 3 is a schematic diagram showing an example of a state in which a molded resin 11 has been removed from the circuit structure 1 shown in FIG. 2. Hereafter, for convenience of description, the side shown in FIG. 1 will be taken as the upper surface side or upper side of the circuit structure 1, and the side shown in FIG. 2 will be taken as the lower surface side or lower side of the circuit structure 1.

The circuit structure 1 is incorporated in an electrical junction box 1000 (see FIG. 34 referred to below), for example. The electrical junction box 1000 is provided on a power supply path between a battery and various electrical components in an automobile, for example. Application of the electrical junction box 1000 is not limited thereto.

As shown in FIGS. 1 to 3, the circuit structure 1 includes an input-side busbar 2, an output-side busbar 3, a relay busbar 4 (see FIGS. 6, 9, etc. referred to below), and an insulating member 5 for insulating the input-side busbar 2, the output-side busbar 3 and the relay busbar 4 from each other. The circuit structure 1 includes a plurality of electronic components 6, a plurality of connectors 7, a plurality of conductive pieces 8, a wiring board 9, a wiring board 19, a plurality of heat dissipation members 10, and the molded resin 11.

The input-side busbar 2 (simply referred to as the busbar 2), the output-side busbar 3 (simply referred to as the busbar 3), and the relay busbar 4 (simply referred to as the busbar 4) are conductive members. The electronic components 6 are switching elements, for example. The electronic components 6 are MOSFETs (Metal-Oxide-Semiconductor Field-Effect Transistors), for example. A MOSFET is a type of semiconductor switching element. The electronic components 6 each include a drain terminal, a source terminal and a gate terminal, for example. The drain terminal, the source terminal and the gate terminal can also be said to be connection terminals. Hereafter, the electronic components 6 may be referred to as MOSFETs 6. The electronic components 6 may be switching elements other than MOSFETs. Also, the electronic components 6 may be electronic components other than switching elements.

The plurality of electronic components 6 include a plurality of electronic components 16 on the wiring board 9 and a plurality of electronic components 26 on the wiring board 19. The plurality of electronic components 16 include a plurality of electronic components 16a and a plurality of electronic components 16b. The plurality of electronic components 26 includes a plurality of electronic components 26a and a plurality of electronic components 26b. Hereafter, the electronic components 16, 16a, 16b, 26, 26a and 26b may be referred to respectively as MOSFETs 16, 16a, 16b, 26, 26a and 26b.

The drain terminals of the plurality of MOSFETs 16a are electrically connected to each other, for example. The drain terminals of the plurality of MOSFETs 16b are electrically connected to each other, for example. The source terminals of the plurality of MOSFETs 16a are electrically connected to each other, for example. The source terminals of the plurality of MOSFETs 16b are electrically connected to each other, for example.

The drain terminals of the plurality of MOSFETs 26a are electrically connected to each other, for example. The drain terminals of the plurality of MOSFETs 26b are electrically connected to each other, for example. The source terminals of the plurality of MOSFETs 26a are electrically connected to each other, for example. The source terminals of the plurality of MOSFETs 26b are electrically connected to each other, for example.

The drain terminals of the MOSFETs 16a and 16b are electrically connected to each other, for example. The drain terminals of the MOSFETs 26a and 26b are electrically connected to each other, for example. The source terminals of the MOSFETs 16a, 16b, 26a and 26b are electrically connected to each other, for example.

The drain terminals of the MOSFETs 16a and 26a are electrically connected to the input-side busbar 2. The drain terminals of the MOSFETs 16b and 26b are electrically connected to the output-side busbar 3. The source terminals of the MOSFETs 16a, 16b, 26a and 26b are electrically connected to the relay busbar 4. In the present example, the circuit structure 1 includes sixteen MOSFETs 6, but the number of MOSFETs 6 included in the circuit structure 1 is not limited thereto.

The input-side busbar 2 is a metal member, and includes a main body part 20 and an input terminal part 21 protruding from the main body part 20, for example. The input terminal part 21 has an open hole 21a that passes through in the thickness direction thereof. A wiring member extending from the battery is connected to the input terminal part 21 by utilizing the open hole 21a, for example. The output voltage of the battery is applied to the input terminal part 21 through the wiring member. The output voltage of the battery applied to the input terminal part 21 is applied to the drain terminals of the MOSFETs 16a and 26a through the main body part 20.

The output-side busbar 3 is a metal member, and includes a main body part 30 and an output terminal part 31 protruding from the main body part 30. The output terminal part 31 has an open hole 31a that passes through in the thickness direction thereof. A wiring member extending from an electrical component is connected to the output terminal part 31 by utilizing the open hole 31a, for example. The voltage that is output by the drain terminals of the MOSFETs 16b and 26b is applied to the output terminal part 31. The voltage applied to the output terminal part 31 is applied as a power supply to the electrical component through the wiring member, for example.

The relay busbar 4 is a metal member. The relay busbar 4 is located between the main body part 20 of the busbar 2 and the main body part 30 of the busbar 3. The relay busbar 4 can be said to be sandwiched between the main body part 20 and the main body part 30.

The plurality of heat dissipation members 10 are each a plate-like metal member, for example. The plurality of heat dissipation members 10 include a heat dissipation member 10a on the busbar 2 and a heat dissipation member 10b on the busbar 3. The heat dissipation member 10a is provided on the lower main surface of the busbar 2. The heat dissipation member 10b is provided on the lower main surface of the busbar 3. Heat generated by the MOSFETs 16a and 26a that is transferred through the busbar 2 is dissipated externally by the heat dissipation member 10a. Heat generated by the MOSFETs 16b and 26b that is transferred through the busbar 3 is dissipated externally by the heat dissipation member 10b.

The insulating member 5 holds the busbars 2, 3 and 4 and the plurality of heat dissipation members 10 while electrically insulating the busbars 2, 3 and 4 from each other. The insulating member 5 is molded as one piece with the busbars 2, 3 and 4 and the plurality of heat dissipation members 10, for example. The insulating member 5 is molded as one piece with the busbars 2, 3 and 4 and the plurality of heat dissipation members 10 by insert molding, for example.

The wiring board 9 is a plate-like member that is long in one direction, for example. The wiring board 9 is provided on the upper main surfaces of the busbars 2, 3 and 4. The wiring board 9 is a rigid board, for example. The wiring board 9 may be a sheet-like flexible board or a composite board integrating a rigid board and a flexible board. The wiring board 9 has a conductive layer. The gate terminal of each MOSFET 16 is electrically connected to the conductive layer of the wiring board 9.

The wiring board 19 is a plate-like member that is long in one direction, for example. The wiring board 19 is provided on the lower main surfaces of the busbars 2, 3 and 4. The wiring board 19 is a rigid board, for example. The wiring board 19 may be a sheet-like flexible board or a composite board integrating a rigid board and a flexible board. The wiring board 19 has a conductive layer. The gate terminal of each MOSFET 26 is electrically connected to the conductive layer of the wiring board 19.

The plurality of connectors 7 each include a plurality of connection terminals 70. Each connection terminal 70 is constituted by a metal, for example. The plurality of connectors 7 include connectors 7a and 7b. The connector 7a is provided on the upper main surface of the wiring board 9. The gate terminals of the plurality of MOSFETs 16 are electrically connected to the plurality of connection terminals 70 included in the connector 7a through the conductive layer of the wiring board 9. Switching control of the MOSFETs 16 is performed externally through the connector 7a.

The connector 7b is provided on the upper main surface of the wiring board 19. An opening is provided in the relay busbar 4 and the wiring board 9. The connector 7b is provided on a portion of the wiring board 19 that is exposed through this opening. The gate terminals of the plurality of MOSFETs 26 are electrically connected to the plurality of connection terminals 70 included in the connector 7b through the conductive layer of the wiring board 19. Switching control of the MOSFETs 26 is performed externally through the connector 7b.

The plurality of conductive pieces 8 include a plurality of conductive pieces 18 on the wiring board 9 and a plurality of conductive pieces 28 on the wiring board 19. The plurality of conductive pieces 18 respectively correspond to the plurality of MOSFETs 16a. Each conductive piece 18 is a member for reducing electrical resistance between the source terminal of the MOSFET 16a corresponding thereto and the busbar 4. The plurality of conductive pieces 18 also respectively correspond to the plurality of MOSFETs 16b. Each conductive piece 18 is also a member for reducing electrical resistance between the source terminal of the MOSFET 16b corresponding thereto and the busbar 4.

The plurality of conductive pieces 28 respectively correspond to the plurality of MOSFETs 26a. Each conductive piece 28 is a member for reducing electrical resistance between the source terminal of the MOSFET 26a corresponding thereto and the busbar 4. The plurality of conductive pieces 28 also respectively correspond to the plurality of MOSFETs 26b. Each conductive piece 28 is also a member for reducing electrical resistance between the source terminal of the MOSFET 26b corresponding thereto and the busbar 4.

The molded resin 11 covers the wiring board 19 and the plurality of MOSFETs 26 and the plurality of conductive pieces 28 on the wiring board 19. The inside of the circuit structure 1 is thereby protected.

Detailed Description of Circuit Structure

Figure 4:
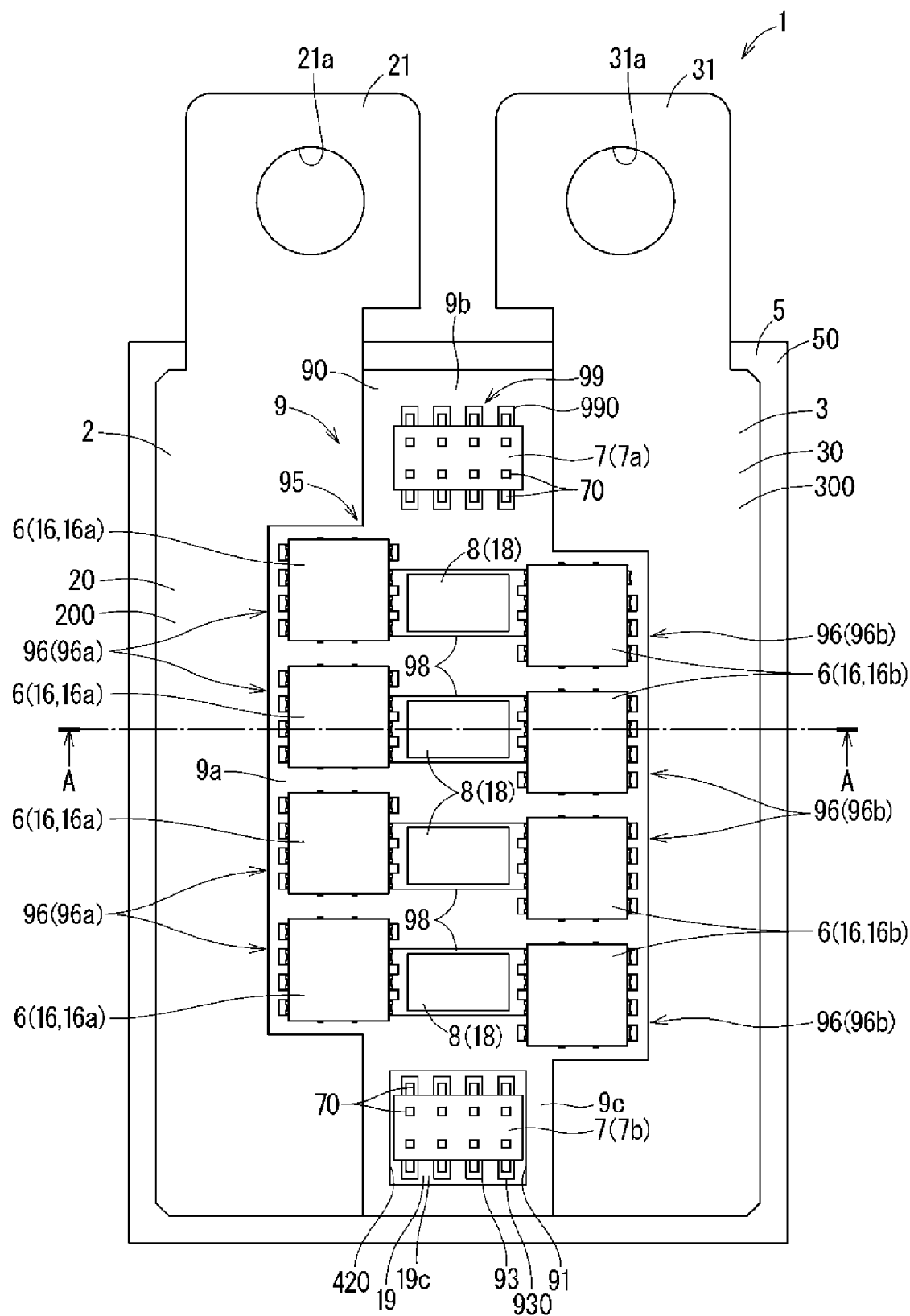
FIG. 4 is a schematic top view showing an example of the circuit structure.
Figure 5:
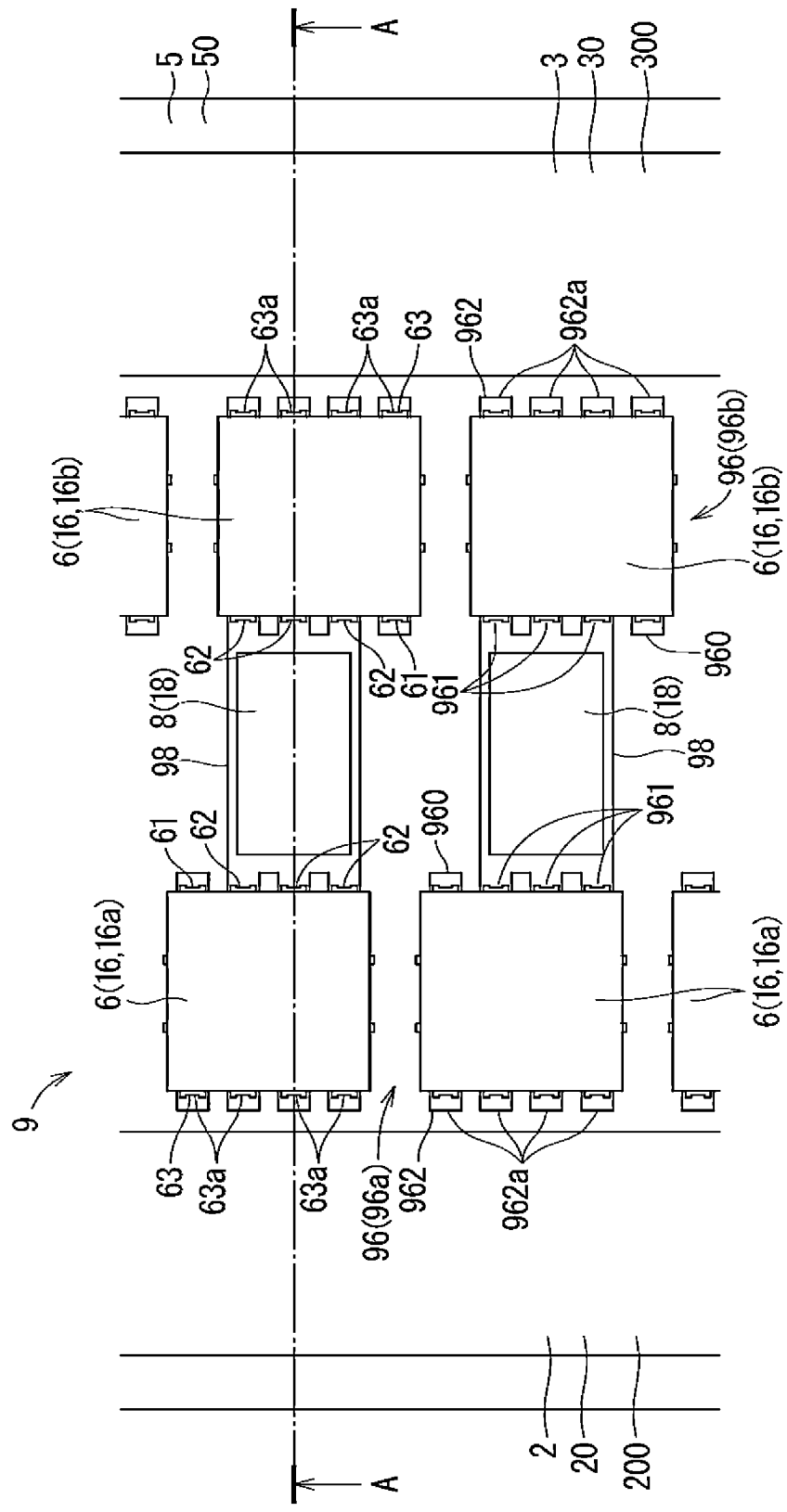
FIG. 5 is a schematic top view showing an example of the circuit structure.
Figure 6:
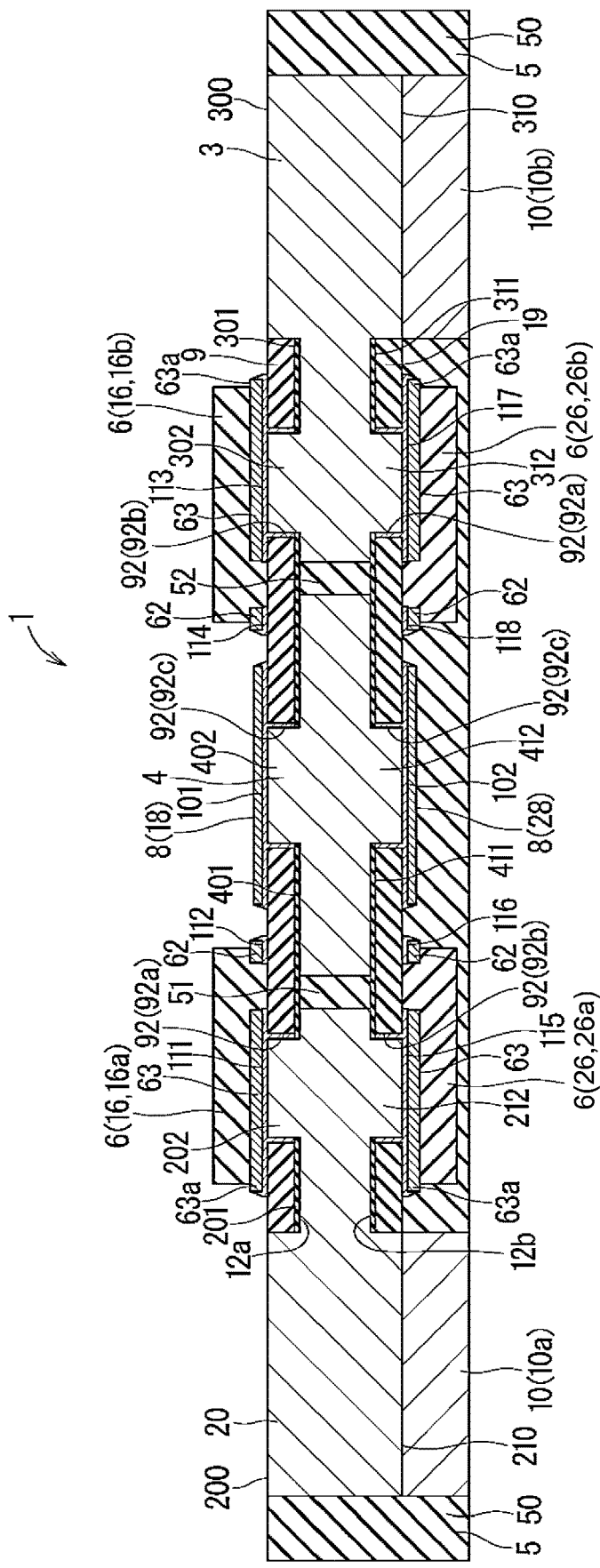
FIG. 6 is a schematic diagram showing an example of a cross-sectional structure of the circuit structure.
Figure 7:
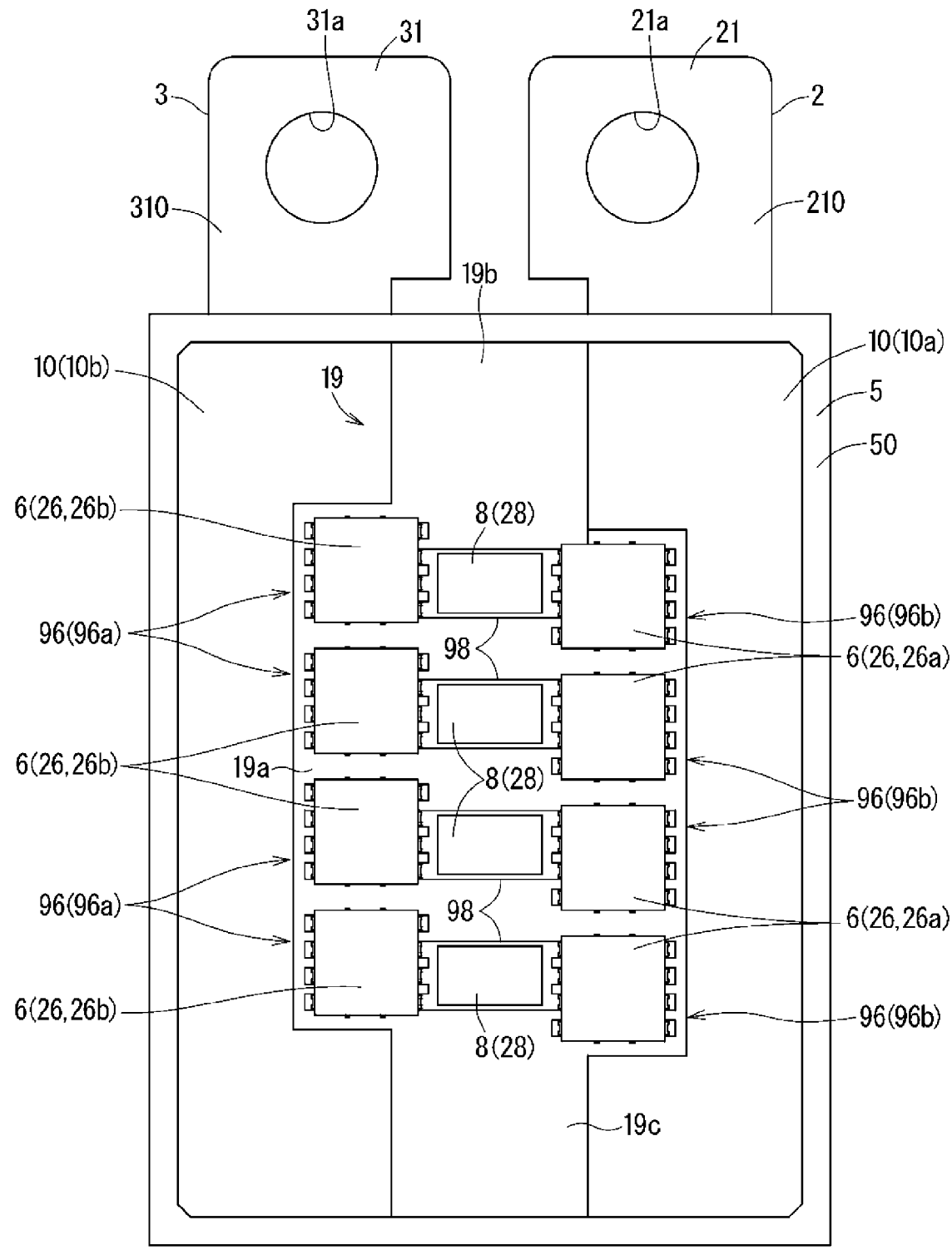
FIG. 7 is a schematic bottom view showing an example of the configuration of part of the circuit structure.
Figure 8:
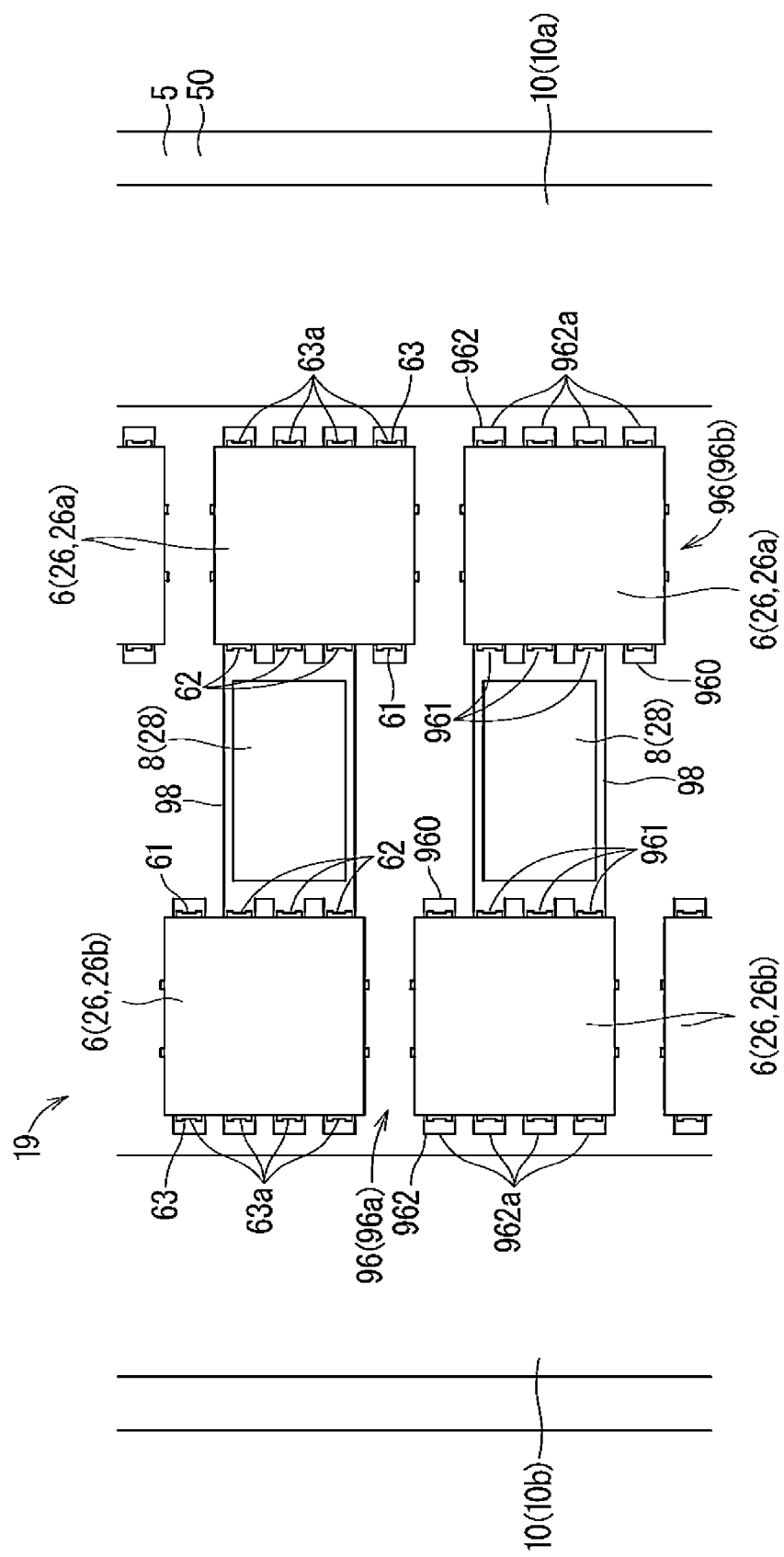
FIG. 8 is a schematic bottom view showing an example of the configuration of part of the circuit structure.
Figure 9:
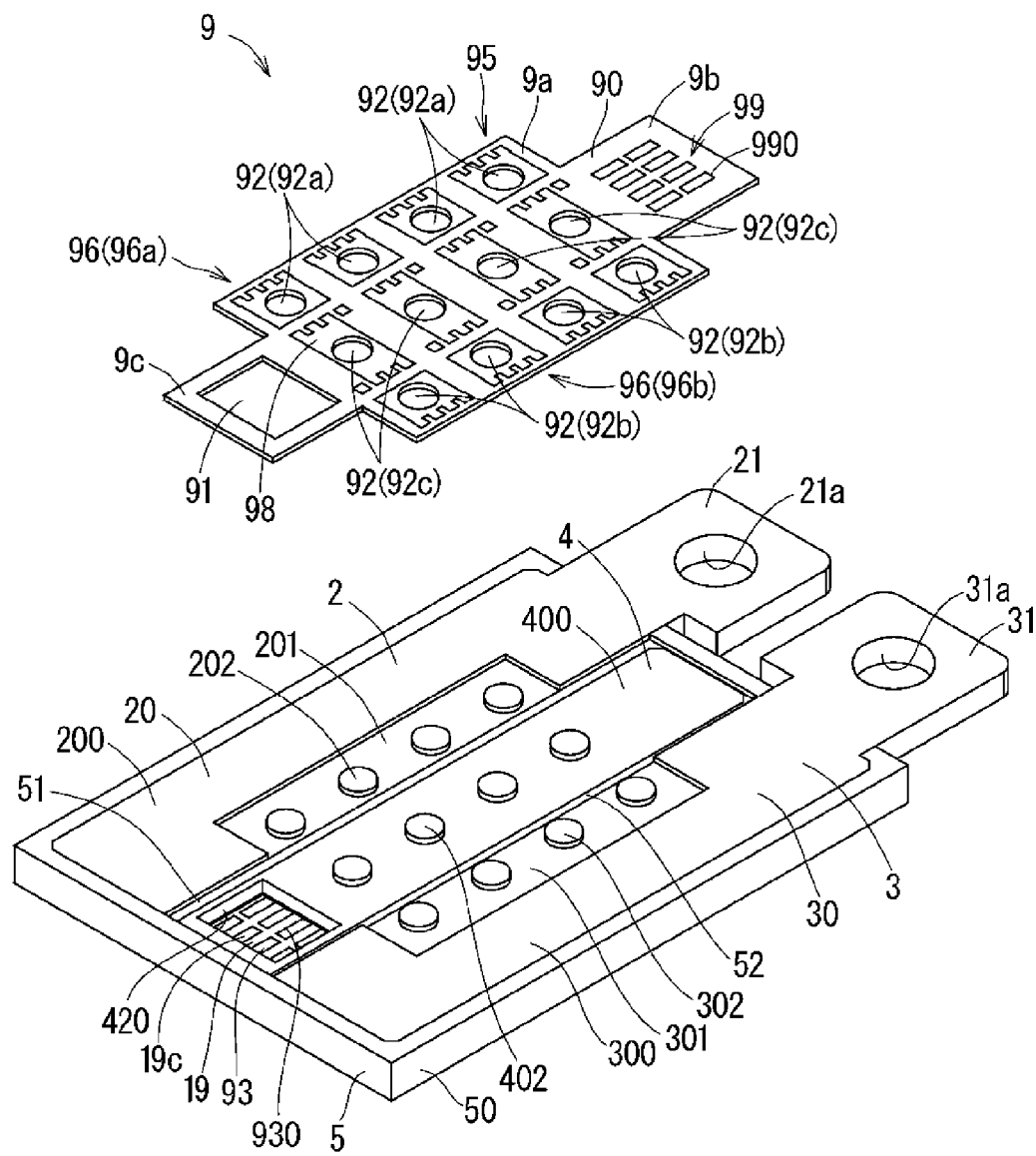
FIG. 9 is a schematic perspective view showing an example of the configuration of part of the circuit structure.
Figure 10:
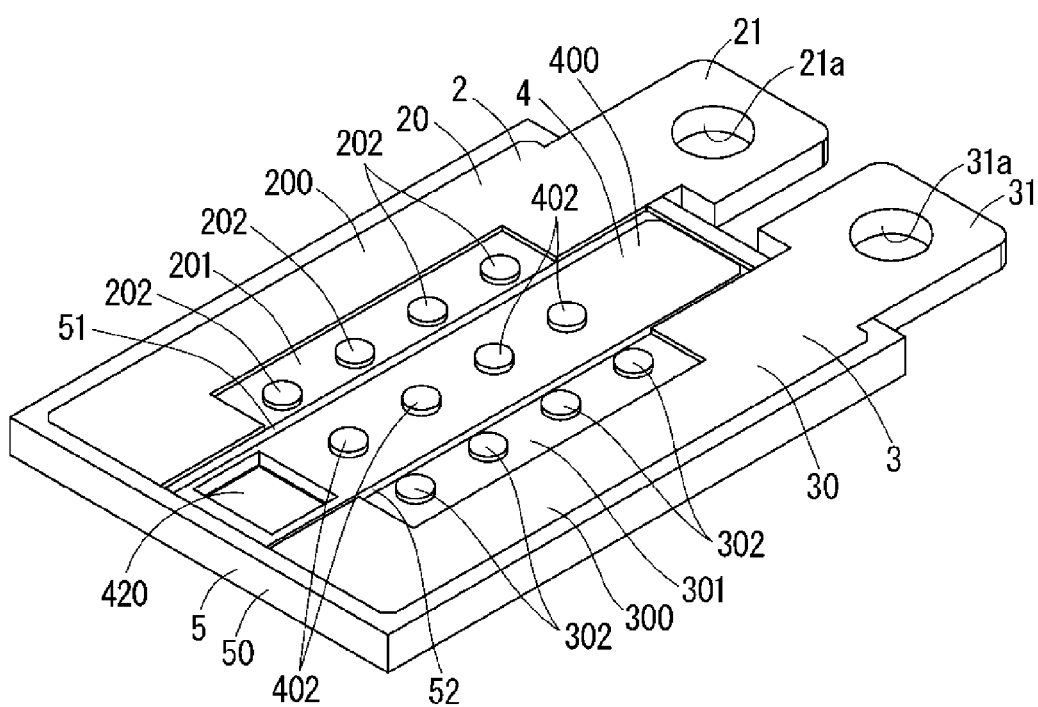
FIG. 10 is a schematic perspective view showing an example of the configuration of part of the circuit structure.
Figure 11:
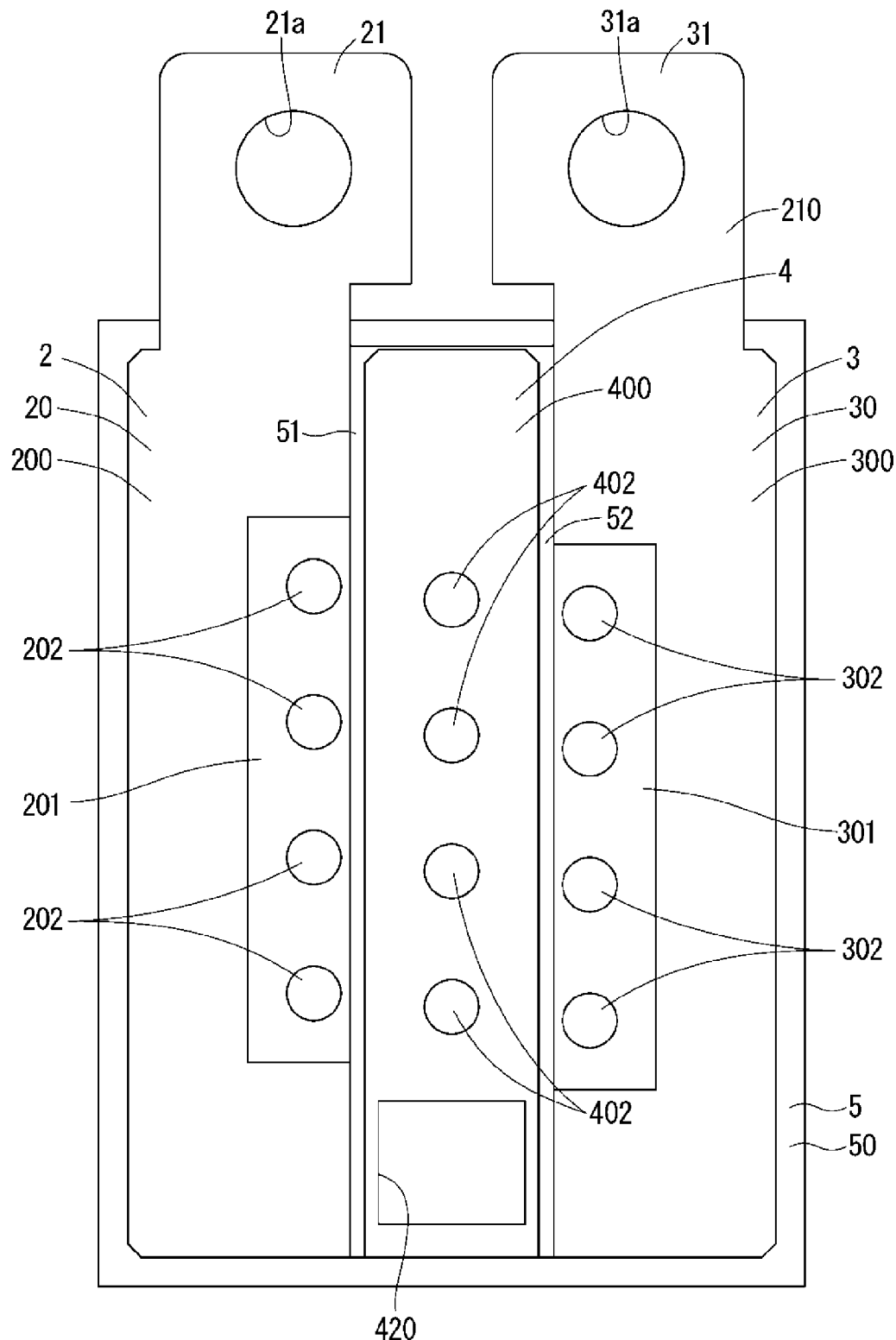
FIG. 11 is a schematic top view showing an example of the configuration of part of the circuit structure.
Figure 12:
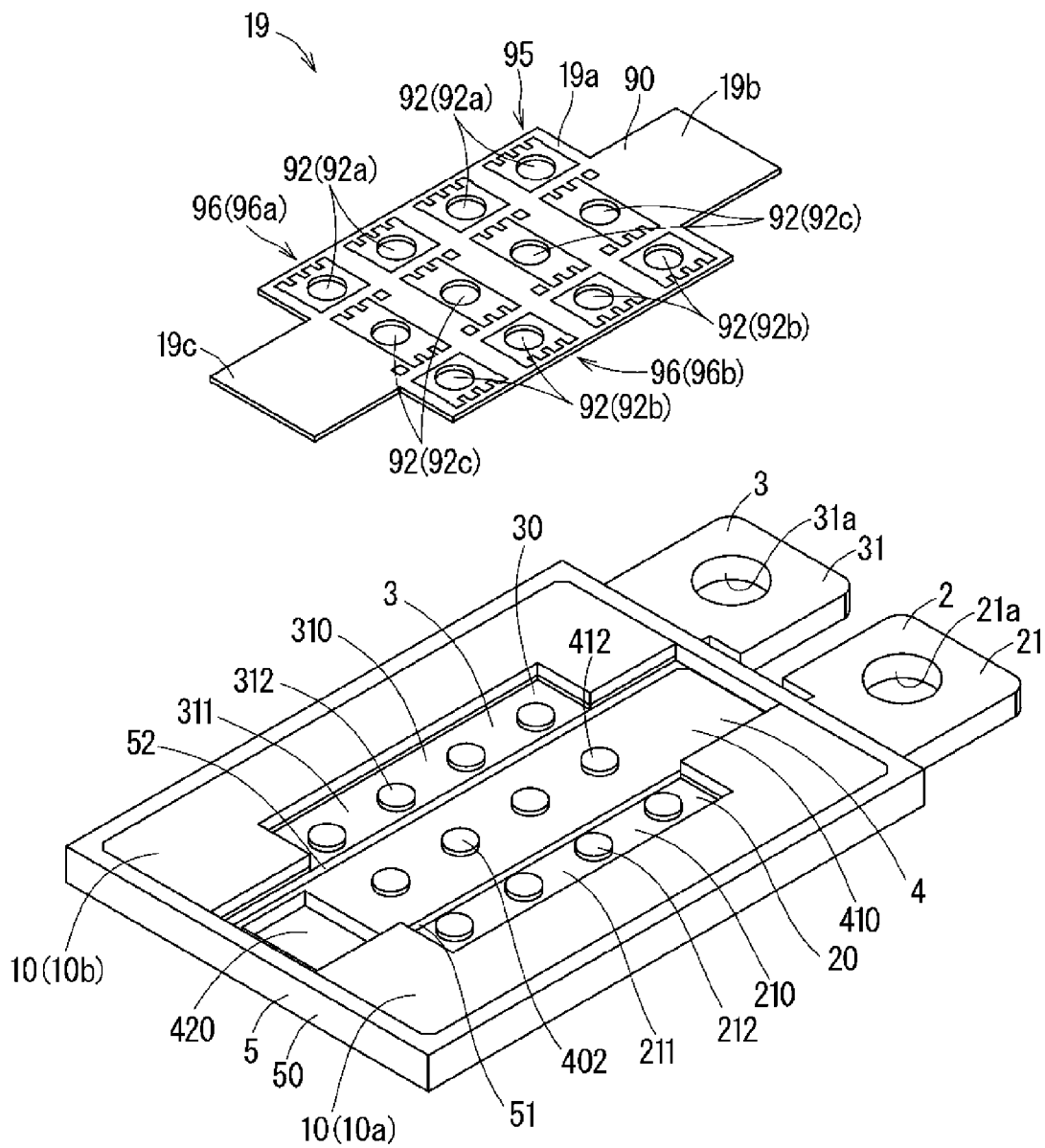
FIG. 12 is a schematic perspective view showing an example of the configuration of part of the circuit structure.
Figure 13:
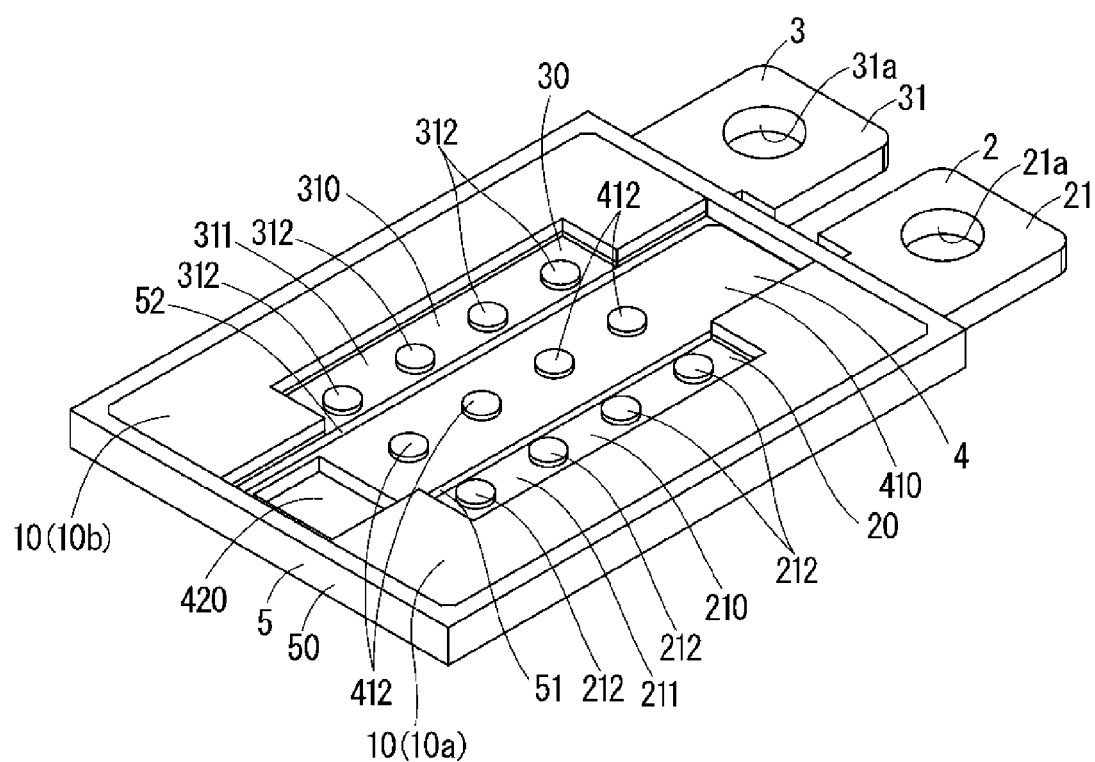
FIG. 13 is a schematic perspective view showing an example of the configuration of part of the circuit structure.
Figure 14:
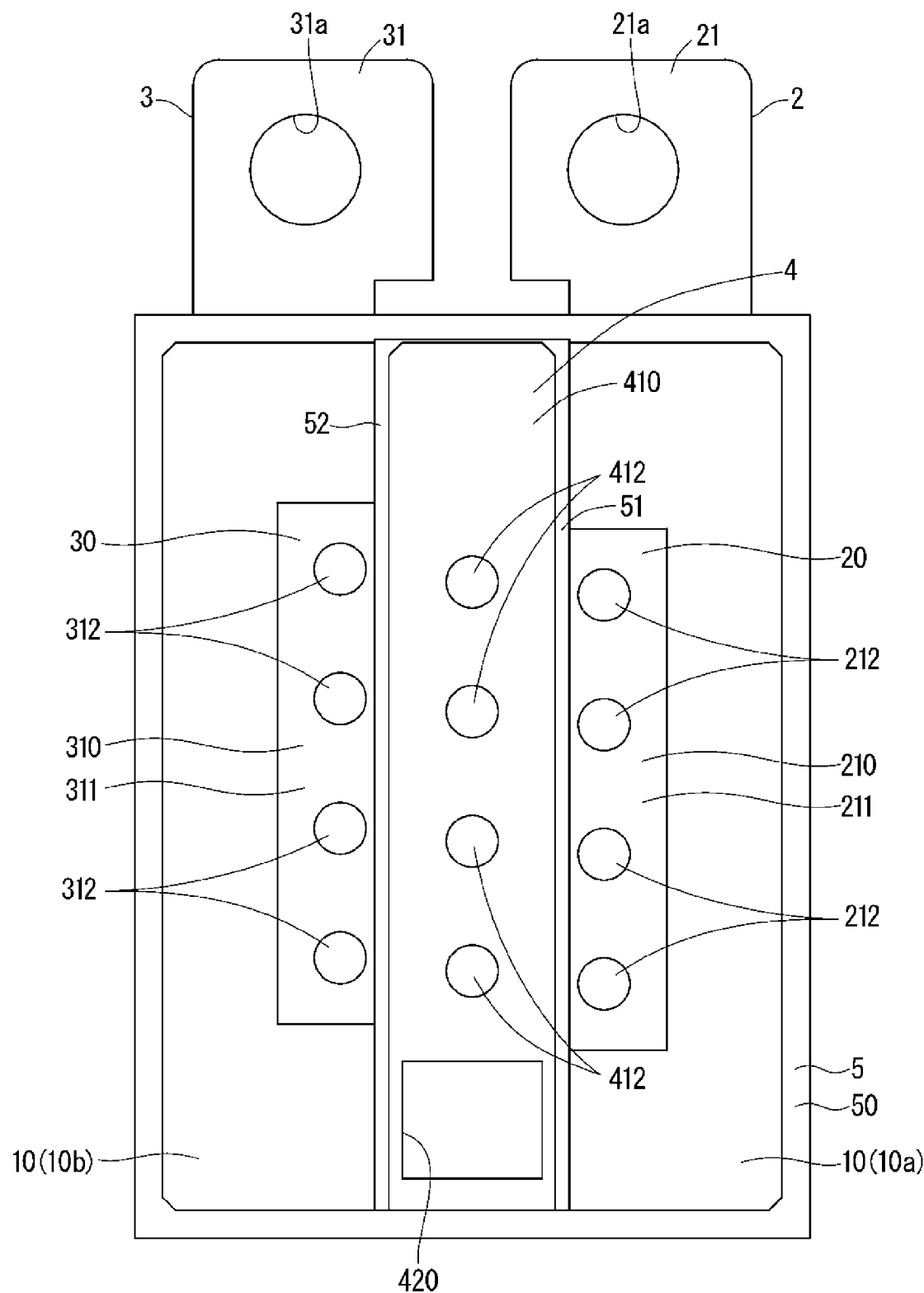
FIG. 14 is a schematic bottom view showing an example of the configuration of part of the circuit structure.

FIG. 4 is a schematic top view showing an example of the circuit structure 1. FIG. 5 is an enlarged schematic top view showing part of the circuit structure 1 shown in FIG. 4. FIG. 6 is a schematic diagram showing an example of the cross-sectional structure taken along a line indicated by arrows A-A in FIGS. 4 and 5. FIG. 7 is a schematic bottom view showing an example of the circuit structure 1 with the molded resin 11 removed. FIG. 8 is an enlarged schematic bottom view showing part of the structure shown in FIG. 7. FIG. 9 is a schematic perspective view from the upper surface side showing an example of a state in which the wiring board 9 is separated from a structure obtained by removing the plurality of MOSFETs 16, the plurality of connectors 7 and the plurality of conductive pieces 18 from the circuit structure 1. FIG. 10 is a schematic perspective view showing an example of a state in which the busbars 2, 3 and 4 and the insulating member 5 are viewed from the upper surface side. FIG. 11 is a schematic top view showing an example of the busbars 2, 3 and 4 and the insulating member 5. FIG. 12 is a schematic perspective view from the lower surface side showing an example of a state in which the wiring board 19 is separated from a structure obtained by removing the molded resin 11, the plurality of MOSFETs 26 and the plurality of conductive pieces 28 from the circuit structure 1. FIG. 13 is a schematic perspective view showing an example of a state in which the busbar 2, 3 and 4, the insulating member 5 and the plurality of heat dissipation members 10 are viewed from the lower surface side. FIG. 14 is a schematic bottom view showing an example of the busbars 2, 3 and 4, the insulating member 5, and the plurality of heat dissipation members 10.

Example Configuration of Busbars

The input-side busbar 2 is constituted by copper, for example. The busbar 2 may be constituted by oxygen-free copper, for example. Oxygen-free copper C1020 specified in Japanese Industrial Standards (JIS), for example, is employed as this oxygen-free copper. The coefficient of linear expansion of the busbar 2 constituted by oxygen-free copper is 17 ppm/° C., for example. The coefficient of linear expansion may also be referred to as the coefficient of thermal expansion. The busbar 2 may also be constituted by a metal other than copper.

As shown in FIGS. 10, 11, 13, 14 and other diagrams, the busbar 2 is a plate-like metal member that is long in one direction, for example. The main body part 20 of the busbar 2 is a rectangular plate-like portion, for example. The input terminal part 21 of the busbar 2 protrudes from one end of the main body part 20 in the long direction thereof.

The busbar 2 has a main surface 200 and a main surface 210 on the opposite side to the main surface 200. The main surface 200 is located on the upper side and the main surface 210 is located on the lower side. Hereafter, the main surface 200 may be referred to as the upper main surface 200, and the main surface 210 may be referred to as the lower main surface 210.

As shown in FIGS. 10, 11 and other diagrams, the upper main surface 200 has a region 201 that is one step lower than other regions thereof. This region 201 is a board mounting region 201 on which the wiring board 9 is mounted. The board mounting region 201 is provided in the main body part 20, for example.

The board mounting region 201 is provided with a plurality of conductive raised parts 202. The plurality of raised parts 202 are constituted by part of the busbar 2, for example. The raised parts 202 can be said to be molded as one piece with the busbar 2. In the present example, the raised parts 202 are part of the busbar 2, and are thus constituted by copper, for example. The plurality of raised parts 202 are aligned in the long direction of the busbar 2.

The raised parts 202 have a disk shape, for example. When the wiring board 9 is mounted on the board mounting region 201, the plurality of raised parts 202 are respectively inserted into a plurality of open holes 92a described later provided in the wiring board 9. The circular end faces of the raised parts 202 lie in the same plane as regions of the upper main surface 200 other than the board mounting region 201, for example. The role of the raised parts 202 will be described in detail later.

As shown in FIGS. 13, 14 and other diagrams, the lower main surface 210 has a region 211 that is one step lower than other regions thereof. This region 211 is a board mounting region 211 on which the wiring board 19 is mounted. The board mounting region 211 is provided in the main body part 20, for example.

The board mounting region 211 is provided with a plurality of conductive raised parts 212. The plurality of raised parts 212 are constituted by part of the busbar 2, for example. In the present example, the raised parts 212 are part of the busbar 2, and are thus constituted by copper, for example. The plurality of raised parts 212 are aligned in the long direction of the busbar 2.

The raised parts 212 have a disk shape, for example. When the wiring board 19 is mounted on the board mounting region 211, the plurality of raised parts 212 are respectively inserted into a plurality of open holes 92*b* described later provided in the wiring board 19. The circular end faces of the raised parts 212 lie in the same plane as regions of the lower main surface 210 other than the board mounting region 211, for example. The role of the raised parts 212 will be described in detail later.

The output-side busbar 3 is constituted by copper, for example. The busbar 3 may be constituted by oxygen-free copper, for example. Oxygen-free copper C1020 specified in JIS, for example, is employed as this oxygen-free copper. The busbar 3 may also be constituted by a metal other than copper.

As shown in FIGS. 10, 11, 13, 14 and other diagrams, the busbar 3 is a plate-like metal member that is long in one direction, for example. The main body part 30 of the busbar 3 is a rectangular plate-like portion, for example. The output terminal part 31 of the busbar 3 protrudes from one end of the main body part 30 in the long direction thereof.

The busbar 3 has a main surface 300 and a main surface 310 on the opposite side to the main surface 300. The main surface 300 is located on the upper side and the main surface 310 is located on the lower side. Hereafter, the main surface 300 may be referred to as the upper main surface 300, and the main surface 310 may be referred to as the lower main surface 310.

As shown in FIGS. 10, 11 and other diagrams, the upper main surface 300 has a region 301 that is one step lower than other regions thereof. This region 301 is a board mounting region 301 on which the wiring board 9 is mounted. The board mounting region 301 is provided in the main body part 30, for example.

The board mounting region 301 is provided with a plurality of conductive raised parts 302. The plurality of raised parts 302 are constituted by part of the busbar 3, for example. In the present example, the raised parts 302 are part of the busbar 3, and are thus constituted by copper, for example. The plurality of raised parts 302 are aligned in the long direction of the busbar 3.

The raised parts 302 have a disk shape, for example. When the wiring board 9 is mounted on the board mounting region 301, the plurality of raised parts 302 are respectively inserted into a plurality of open holes 92*b* provided in the wiring board 9. The end faces of the raised parts 302 lie in the same plane as regions of the upper main surface 300 other than the board mounting region 301, for example. The role of the raised parts 302 will be described in detail later.

As shown in FIGS. 13, 14 and other diagrams, the lower main surface 310 has a region 311 that is one step lower than the other regions thereof. This region 311 is a board mounting region 311 on which the wiring board 19 is mounted. The board mounting region 311 is provided in the main body part 30, for example.

The board mounting region 311 is provided with a plurality of conductive raised parts 312. The plurality of raised parts 312 are constituted by part of the busbar 3, for example. In the present example, the raised parts 312 are part of the busbar 3, and are thus constituted by copper, for example. The plurality of raised parts 312 are aligned in the long direction of the busbar 3.

The raised parts 312 have a disk shape, for example. When the wiring board 19 is mounted on the board mounting region 311, the plurality of raised parts 312 are respectively inserted into a plurality of open holes 92*a* described later provided in the wiring board 19. The end faces of the raised parts 312 lie in the same plane as regions of the lower main surface 310 other than the board mounting region 311, for example. The role of the raised parts 312 will be described in detail later.

The relay busbar 4 is constituted by copper, for example. The busbar 4 may be constituted by oxygen-free copper, for example. Oxygen-free copper C1020 specified in JIS, for example, is employed as this oxygen-free copper. The busbar 4 may also be constituted by a metal other than copper.

As shown in FIGS. 10, 11, 13, 14 and other diagrams, the busbar 4 is a rectangular plate-like metal member, for example. The busbars 2, 3 and 4 lie in the same plane, for example. The busbars 2 and 3 are disposed opposite each other with a gap therebetween such that the long directions thereof are parallel to each other. The busbar 4 is located between the busbars 2 and 3 such that the long direction thereof is parallel to the long directions of the busbars 2 and 3. The busbar 4 is located between the main body part 20 of the busbar 2 and the main body part 30 of the busbar 3.

The busbar 4 has a main surface 400 and a main surface 410 on the opposite side to the main surface 400. The main surface 400 is located on the upper side and the main surface 410 is located on the lower side. The wiring board 9 is mounted on the main surface 400, and the wiring board 19 is mounted on the main surface 410. Hereafter, the main surface 400 may be referred to as the upper main surface 400, and the main surface 410 may be referred to as the lower main surface 410.

As shown in FIGS. 10, 11 and other diagrams, the upper main surface 400 is provided with a plurality of conductive raised parts 402. The plurality of raised parts 402 are constituted by part of the busbar 4, for example. In the present example, the raised parts 402 are part of the busbar 4, and are thus constituted by copper, for example. The plurality of raised parts 402 are aligned in the long direction of the busbar 4. The plurality of raised parts 402 are located between the plurality of raised parts 202 of the busbar 2 and the plurality of raised parts 302 of the busbar 3.

The raised parts 402 have a disk shape, for example. When the wiring board 9 is mounted on the upper main surface 400, the plurality of raised parts 402 are respectively inserted into a plurality of open holes 92*c* described later provided in the wiring board 9. The end faces of the raised parts 402 lie in the same plane as the end faces of the raised parts 202 of the busbar 2 and the end faces of the raised parts 302 of the busbar 3, for example.

Regions of the upper main surface 400 of the busbar 4 where the raised parts 402 are not provided lie in the same plane as regions of the board mounting region 201 of the busbar 2 where the raised parts 202 are not provided, for example. Also, regions of the upper main surface 400 of the busbar 4 where the raised parts 402 are not provided lie in the same plane as regions of the board mounting region 301 of the busbar 3 where the raised parts 302 are not provided, for example. The role of the raised parts 402 will be described in detail later.

As shown in FIGS. 13, 14 and other diagrams, the lower main surface 410 is provided with a plurality of conductive raised parts 412. The plurality of raised parts 412 are constituted by part of the busbar 4, for example. In the present example, the raised parts 412 are part of the busbar 4, and are thus constituted by copper, for example. The plurality of raised parts 412 are aligned in the long direction of the busbar 4. The plurality of raised parts 412 are located between the plurality of raised parts 212 of the busbar 2 and the plurality of raised parts 312 of the busbar 3.

The raised parts 412 have a disk shape, for example. When the wiring board 19 is mounted on the lower main surface 410, the plurality of raised parts 412 are respectively inserted into a plurality of open holes 92c described later provided in the wiring board 19. The end faces of the raised parts 412 lie in the same plane as the end faces of the raised parts 212 of the busbar 2 and the end faces of the raised parts 312 of the busbar 3, for example.

Regions of the lower main surface 410 of the busbar 4 where the raised parts 412 are not provided lie in the same plane as regions of the board mounting region 211 of the busbar 2 where the raised parts 212 are not provided, for example. Also, regions of the lower main surface 410 of the busbar 4 where the raised parts 412 are not provided lie in the same plane as regions of the board mounting region 311 of the busbar 3 where the raised parts 312 are not provided, for example. The role of the raised parts 412 will be described in detail later.

An opening 420 is provided in one end of the busbar 4 in the long direction thereof. The opening 420 passes through the busbar 4 in the thickness direction of the busbar 4. The connector 7b is disposed in this opening 420 as described later.

The thickness of the thickest portion in the busbar 2 is set to 3 mm, for example. Also, the thickness of the thickest portion in the busbar 3 is set to 3 mm, for example. Also, the thickness of the thickest portion in the busbar 4 is set to 3 mm, for example. The thicknesses of busbars 2, 3 and 4 are not limited thereto.

Example Configuration of Heat Dissipation Members

The heat dissipation members 10 are constituted by aluminum, for example. The plate-like heat dissipation members 10 can also be said to be heat sinks. The heat dissipation members 10 may be constituted by pure aluminum. Pure aluminum A1050 specified in JIS, for example, is employed as this pure aluminum. The heat dissipation members 10 may be constituted by a metal other than aluminum. The thickness of the heat dissipation members 10 is set to 1.5 mm, for example. The thickness of the heat dissipation members 10 is not limited thereto.

As shown in FIGS. 6, 12, 13 and other diagrams, the heat dissipation member 10a is provided on the lower main surface 210 of the busbar 2. The heat dissipation member 10a is provided on the lower main surface of the main body part 20 of the busbar 2, for example. The heat dissipation member 10a is provided on a region of the lower main surface of the main body part 20 other than the board mounting region 211, for example. The heat dissipation member 10a is diffusion-bonded to the busbar 2 using pressure treatment and heat treatment, for example. The main surface of the heat dissipation member 10a on the opposite side to the main surface bonded to the busbar 2 (in other words, the exposed main surface) is anodized, for example. Electrical insulation between the heat dissipation member 10a and members other than the circuit structure 1 can thereby be enhanced.

The heat dissipation member 10b is provided on the lower main surface 310 of the busbar 3. The heat dissipation member 10b is provided on the lower main surface of the main body part 30 of the busbar 3, for example. The heat dissipation member 10b is provided on a region of the lower main surface of the main body part 30 other than the board mounting region 311, for example. The heat dissipation member 10b is diffusion-bonded to the busbar 3 using pressure treatment and heat treatment, for example. The main surface of the heat dissipation member 10b on the opposite side to the main surface bonded to the busbar 3 (in other words, the exposed main surface) is anodized, for example. Electrical insulation between the heat dissipation member 10b and members other than the circuit structure 1 can thereby be enhanced.

Example Configuration of Insulating Member

The insulating member 5 is constituted by an insulating resin, for example. The insulating member 5 is constituted by PPS (Polyphenylene Sulfide), for example. The insulating member 5 is molded as one piece with the busbars 2, 3 and 4 and the plurality of heat dissipation members 10, for example. The coefficient of linear expansion of the insulating member 5 constituted by PPS is 40 ppm/° C., for example.

As shown in FIGS. 11, 14 and other diagrams, the insulating member 5 includes a frame-like insulating portion 50 and straight insulating portions 51 and 52 that are joined to the insulating portion 50. The frame-like insulating portion 50 is attached to the main body part 20 of the busbar 2, the heat dissipation member 10a on the main body part 20, the busbar 4, the main body part 30 of the busbar 3 and the heat dissipation member 10b on the main body part 30, so as to surround the main body part 20, the heat dissipation member 10a, the busbar 4, the main body part 30 and the heat dissipation member 10b. The insulating portion 51 is located between the main body part 20 and the busbar 4. The busbars 2 and 4 are electrically insulated from each other by the insulating portion 51. The insulating portion 52 is located between the main body part 30 and the busbar 4. The busbars 3 and 4 are electrically insulated from each other by the insulating portion 52.

As shown in FIG. 11 and other diagrams, the board mounting region 201 on the upper side of the busbar 2 and the upper main surface 400 of the busbar 4 are adjacent to each other via the insulating portion 51. The board mounting region 301 on the upper side of the busbar 3 and the upper main surface 400 of the busbar 4 are adjacent to each other via the insulating portion 52.

As shown in FIG. 14 and other diagrams, the board mounting region 211 on the lower side of the busbar 2 and the lower main surface 410 of the busbar 4 are adjacent to each other via the insulating portion 51. The board mounting region 311 on the lower side of the busbar 3 and the lower main surface 410 of the busbar 4 are adjacent to each other via the insulating portion 52.

Example Configuration of MOSFET

Figure 15:
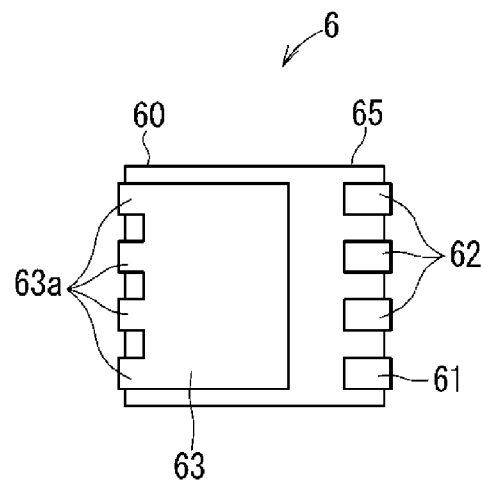
FIG. 15 is a schematic back view showing an example of an electronic component.

FIG. 15 is a schematic back view showing an example of the MOSFET 6. Here, for convenience of description, the configuration of the MOSFET 6 will be described with the right side and the left side in FIG. 15 respectively being the right side and the left side of the MOSFET 6, and the up-down direction in FIG. 15 being the up-down direction of the MOSFET 6.

The MOSFET 6 is a surface mount component, for example. As shown in FIG. 15, the MOSFET 6 includes a package 60 in which a semiconductor device and the like are housed. The package 60 is a leadless package, for example. The package 60 includes a main body part 65, a gate terminal 61, a plurality of source terminals 62 and a drain terminal 63. The gate terminal 61, the plurality of source terminals 62 and the drain terminal 63 are provided on the back surface of the main body part 65.

The main body part 65 is constituted by a resin such as epoxy resin, for example. The plurality of source terminals 62 are electrically connected to each other inside the main body part 65. The gate terminal 61, the source terminals 62 and the drain terminal 63 are constituted by a metal, for example. The gate terminal 61, the source terminals 62 and the drain terminal 63 may be constituted by oxygen-free copper, for example. Oxygen-free copper C1020 specified in JIS, for example, is employed as this oxygen-free copper. The gate terminal 61, the source terminals 62 and the drain terminal 63 may also be constituted by a copper alloy. The gate terminal 61, the source terminals 62 and the drain terminal 63 have a flat plate-like shape, for example.

On the right edge portion of the back surface of the main body part 65, the gate terminal 61 and the plurality of source terminals 62 are aligned in a row in the up-down direction. The gate terminal 61 and the plurality of source terminals 62 protrude slightly outward from the right edge of the back surface of the main body part 65. The left edge of the drain terminal 63 is uneven, and a plurality of protruding parts 63a aligned in the up-down direction are provided on the left edge. The plurality of protruding parts 63a protrude slightly outward from the left edge of the back surface of the main body part 65.

Note that the shape of the package 60 is not limited to the above example. The shape of the drain terminal 63 may, for example, be other than the shape in FIG. 15. Also, the number of source terminals 62 that are included in the package 60 may be other than three. Also, the package 60 may be a leaded package.

Example Configuration of Wiring Boards

Figure 16:
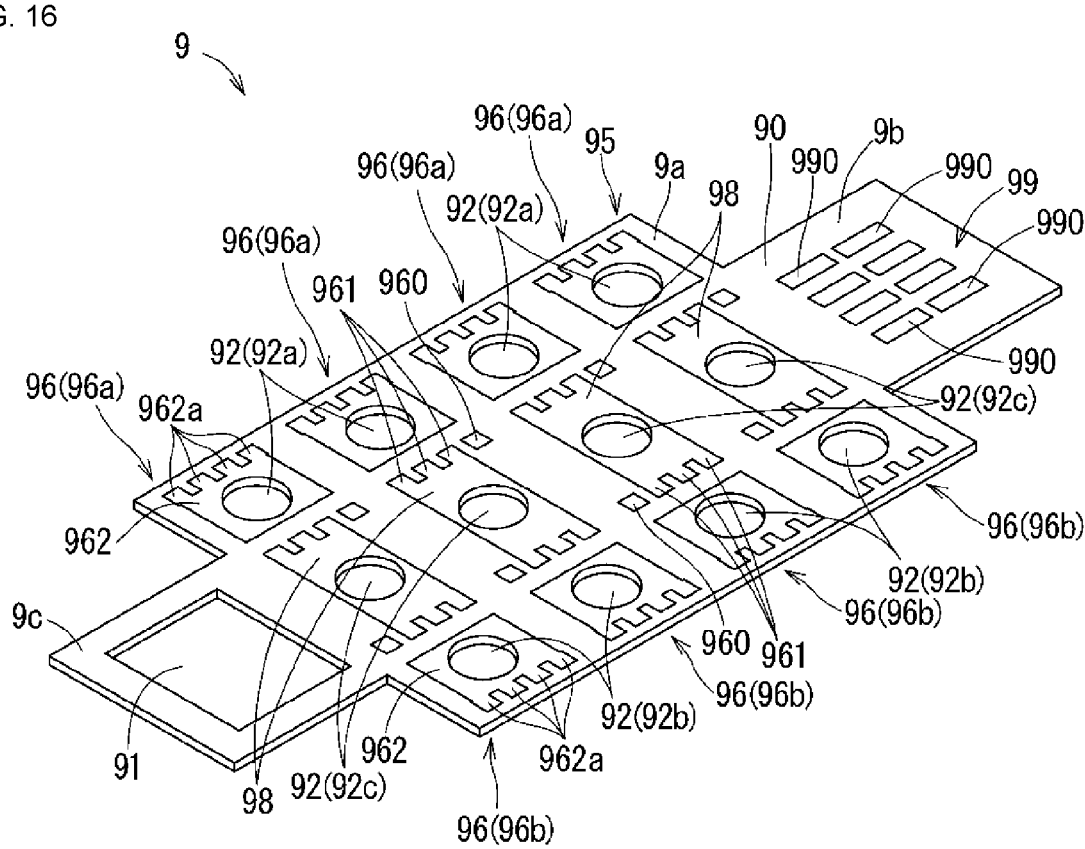
FIG. 16 is a schematic perspective view showing an example of a wiring board.

FIG. 16 is a schematic perspective view showing an example of the wiring board 9. As shown in FIGS. 9, 16 and other diagrams, the wiring board 9 includes an insulating board 90 and the insulating board 90 is provided with a conductive layer 95, for example. The insulating board 90 may be a ceramic board or a board containing a resin, for example. In the latter case, the insulating board 90 may be a glass epoxy board or another board containing a resin. The thickness of the insulating board 90 may be set from 0.4 mm to 0.6 mm inclusive, for example. The conductive layer 95 may be constituted by copper or may be constituted by another metal. The conductive layer 95 is provided on one main surface of the insulating board 90, for example. The wiring board 9 has the conductive layer 95 on one main surface thereof. Hereinafter, for convenience of description, the main surface on the conductive layer 95 side of the wiring board 9 and insulating board 90 will be referred to as the front main surface, and the main surface on the opposite side will be referred to as the back main surface.

The wiring board 9 may be a single-layer board or a multilayer board. The wiring board 9 may have a conductive layer not only on the front main surface but also on the back main surface, and may have a conductive layer as an inner layer. Note that, in FIG. 6, illustration of the conductive layer 95 is omitted.

The wiring board 9 includes a first portion 9a on which the MOSFETs 6 and the conductive pieces 8 are installed, and a second portion 9b and a third portion 9c that protrude from the first portion 9a. The outer shape of the first portion 9a is substantially rectangular, for example. The outer shapes of the second portion 9b and the third portion 9c are substantially square, for example. The second portion 9b protrudes from one end of the first portion 9a in the long direction thereof. The third portion 9c protrudes from the other end of the first portion 9a in the long direction thereof.

The first portion 9a includes a plurality of open holes 92 that pass through in the thickness direction thereof. The plurality of open holes 92 include a plurality of open holes 92a provided in one edge portion of the first portion 9a in the short direction thereof, so as to be aligned in the long direction of the wiring board 9. Also, the plurality of open holes 92 include a plurality of open holes 92b provided in the other edge portion of the first portion 9a in the short direction thereof, so as to be aligned in the long direction of the wiring board 9. Furthermore, the plurality of open holes 92 include a plurality of open holes 92c provided in the middle portion of the first portion 9a in the short direction thereof, so as to be aligned in the long direction of the wiring board 9. The plurality of open holes 92c are located between the plurality of open holes 92a and the plurality of open holes 92b.

The conductive layer 95 of the wiring board 9 includes a plurality of conductive regions 96, as shown in FIGS. 9, 16 and other diagrams. The plurality of conductive regions 96 respectively correspond to the plurality of MOSFETs 16. Furthermore, the conductive layer 95 includes a plurality of extension regions 98 and a conductive region 99. The conductive region 99 corresponds to the connector 7a.

Each conductive region 96 has a land 960 to which the gate terminal 61 of the MOSFET 16 corresponding thereto is bonded. Each conductive region 96 has a plurality of lands 961 to which the plurality of source terminals 62 of the MOSFET 16 corresponding thereto are respectively bonded. Each conductive region 96 has a land 962 to which the drain terminal 63 of the MOSFET 16 corresponding thereto is bonded. Each land 962 has a plurality of protruding parts 962a to which the plurality of the protruding parts 63a of the drain terminal 63 are respectively bonded. Lands to which a terminal or the like is bonded are also referred to as pads.

The plurality of conductive regions 96 include a plurality of conductive regions 96a and a plurality of conductive regions 96b. The plurality of conductive regions 96a respectively correspond to the plurality of MOSFETs 16a. The plurality of conductive regions 96b respectively correspond to the plurality of MOSFETs 16b.

In the present example, the MOSFETs 16a and the MOSFETs 16b are disposed so as to oppose each other one-to-one. One MOSFET 16a and one MOSFET 16b disposed opposing each other constitute a first FET pair. The circuit structure 1 includes a plurality of first FET pairs on the upper side.

The plurality of extension regions 98 respectively correspond to the plurality of first FET pairs. The extension regions 98 are regions extending from the plurality of lands 961 to which the plurality of source terminals 62 of the MOSFET 16a included in the first FET pair corresponding thereto are bonded. The extension regions 98 are also regions extending from the plurality of lands 961 to which the plurality of source terminals 62 of the MOSFET 16b included in the first FET pair corresponding thereto are bonded. The plurality of lands 961 to which the plurality of source terminals 62 of the MOSFET 16a included in each first FET pair are bonded are connected to the plurality of lands 961 to which the plurality of source terminals 62 of the MOSFET 16b included in that first FET pair are bonded, by the extension region 98 corresponding to that first FET pair. The lands 961 can also be said to be protruding parts protruding from the extension regions 98.

The plurality of conductive regions 96a respectively correspond to the plurality of open holes 92a. Also, the plurality of conductive regions 96b respectively correspond to the plurality of open holes 92b. The land 962 of each conductive region 96a is located around the open hole 92a corresponding to that conductive region 96a. The land 962 of each conductive region 96b is located around the open hole 92b corresponding to that conductive region 96b. The lands 962 are provided so as to surround the opening edges of the open holes 92 (specifically, the opening edges on the main surface on the conductive layer 95 side of the wiring board 9). The open holes 92 can also be said to be provided in the lands 962.

The plurality of extension regions 98 respectively correspond to the plurality of open holes 92c. Each extension region 98 is located around the open hole 92c corresponding thereto. The extension regions 98 are provided so as to surround the opening edges of the open holes 92c (specifically, the opening edges on the main surface on the conductive layer 95 side of the wiring board 9). The open holes 92c can also be said to be provided in the extension regions 98.

In the present example, the open holes 92 are through holes in which a conductive region is formed on the inner circumferential surface thereof, for example. The conductive region on the inner circumferential surface of the open holes 92 is constituted by a metal, for example. The conductive region on the inner circumferential surface of the open holes 92 may be constituted by the same material as the conductive layer 95 or may be constituted by a different material. The conductive region on the inner circumferential surface of each open hole 92a is joined to the land 962 around that open hole 92a. The conductive region on the inner peripheral surface of each open hole 92b is joined to the land 962 around that open hole 92b. The conductive region on the inner peripheral surface of each open hole 92c is connected to the extension region 98 around that open hole 92c. Note that a conductive region may not be formed on the inner circumferential surface of the open holes 92.

The conductive region 99 corresponding to the connector 7a includes a plurality of lands 990 to which the plurality of connection terminals 70 included in the connector 7a are respectively bonded. The plurality of connection terminals 70 of the connector 7a are bonded to the plurality of lands 990 by solder, for example. The main component of the solder is tin.

The conductive layer 95 includes a plurality of first wires respectively electrically connected to the gate terminals 61 of the plurality of MOSFETs 16. The plurality of first wirings are respectively joined at one end to the plurality of lands 960 to which the gate terminals 61 of the plurality of MOSFETs 16 are bonded. The plurality of first wirings are respectively joined at the other end to the plurality of lands 990 to which the plurality of connection terminals 70 of the connector 7a are bonded. The gate terminals 61 are electrically connected to the connection terminals 70 of the connector 7a through the first wirings.

Figure 17:
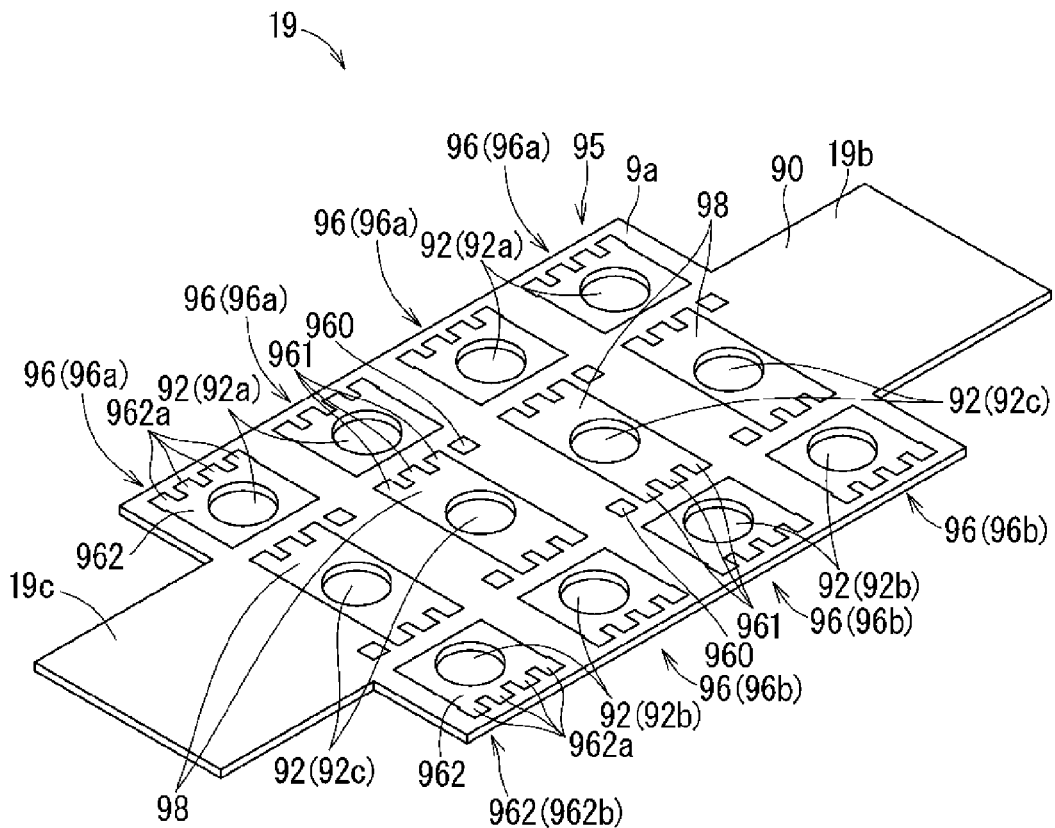
FIG. 17 is a schematic perspective view showing an example of a wiring board.

FIG. 17 is a schematic perspective view showing an example of the wiring board 19. The wiring board 19 has a substantially similar structure to the wiring board 9. As shown in FIGS. 12, 17 and other diagrams, the wiring board 19 has an insulating board 90 and a conductive layer 95, similarly to the wiring board 9. Also, the wiring board 19 includes a first portion 19a on which the MOSFETs 6 and the conductive pieces 8 are installed, and a second portion 19b and a third portion 19c that protrude from the first portion 19a. The first portion 19a has a similar structure to the first portion 9a of the wiring board 9. The first portion 19a has a plurality of open holes 92, a plurality of conductive regions 96, and a plurality of extension regions 98. Hereafter, for convenience of description, the main surface on the conductive region 96 side of the wiring board 19 will be referred to as the front side main surface, and the main surface on the opposite side will be referred to as the back main surface.

The outer shapes of the second portion 19b and the third portion 19c are substantially square, for example. The second portion 19b protrudes from one end of the first portion 9a in the long direction thereof. The third portion 19c protrudes from the other end of the first portion 9a in the long direction thereof. Unlike the second portion 9b, the second portion 19b is not provided with a conductive region. A conductive region 93 corresponding to the connector 7b is provided in the third portion 19c, on the main surface on the back main surface side of the wiring board 19 (see FIG. 9, etc.).

In the wiring board 19, the plurality of conductive regions 96 respectively correspond to the plurality of MOSFETs 26. The plurality of conductive regions 96a respectively correspond to the plurality of MOSFETs 26b, and the plurality of conductive regions 96b respectively correspond to the plurality of MOSFETs 26a. The gate terminal 61 of the MOSFET 26 to which each conductive region 96 corresponds is bonded to the land 960 of that conductive region 96. The plurality of source terminals 62 of the MOSFET 26 corresponding to each conductive region 96 are respectively bonded to the plurality of lands 961 of that conductive region 96. The drain terminal 63 of the MOSFET 26 corresponding to each conductive region 96 is bonded to the land 962 of that conductive region 96.

In the present example, as shown in FIG. 3 and other diagrams, the MOSFETs 26a and the MOSFETs 26b are disposed so as to oppose each other one-to-one. One MOSFET 26a and one MOSFET 26b disposed opposing each other constitute a second FET pair. The circuit structure 1 includes a plurality of second FET pairs on the lower side.

The plurality of extension regions 98 of the wiring board 19 respectively correspond to the plurality of second FET pairs. Each extension region 98 is a region extending from the plurality of lands 961 to which the plurality of source terminals 62 of the MOSFET 26a included in the second FET pair corresponding thereto are bonded. Also, each extension region 98 is a region extending from the plurality of lands 961 to which the plurality of source terminals 62 of the MOSFET 26b included in the second FET pair corresponding thereto are bonded. The plurality of lands 961 to which the plurality of source terminals 62 of the MOSFET 26a included in each second FET pair are bonded are connected to the plurality of lands 961 to which the plurality of source terminals 62 of the MOSFET 26b included in that second FET pair are bonded, by the extension region 98 corresponding to that second FET pair.

The conductive region 93 provided in the third portion 19c has a similar shape to the conductive region 99 corresponding to the connector 7a. The conductive region 93 includes a plurality of lands 930 to which the plurality of connection terminals 70 included in the connector 7b are respectively bonded. The plurality of connection terminals 70 of the connector 7b are bonded to the plurality of lands 930 by solder, for example.

The conductive layer 95 of the wiring board 19 has a plurality of second wirings that are respectively electrically connected to the gate terminals 61 of the plurality of MOSFETs 26, instead of the plurality of first wirings. The plurality of second wirings are respectively joined at one end to the plurality of lands 960 to which the gate terminals 61 of the plurality of MOSFETs 26 are bonded. The plurality of second wirings are respectively joined at the other end to the plurality of lands 930 to which the plurality of connection terminals 70 of the connector 7b are bonded. The gate terminals 61 of the MOSFETs 26 are electrically connected to the connection terminals 70 of the connector 7b through the second wirings.

The wiring board 9 having a configuration such as the above is mounted on the board mounting region 201 of the busbar 2, the insulating portion 51 between the busbar 2 and the busbar 4, the upper main surface 400 of the busbar 4, the insulating portion 52 between the busbar 4 and the busbar 3, and the board mounting region 301 of the busbar 3. Hereafter, the board mounting region 201, the insulating portion 51, the upper main surface 400 of the busbar 4, the insulating portion 52 and the board mounting region 301 on which the wiring board 9 is mounted may be collectively referred to as the upper board mounting region. Also, the raised parts 202 on the board mounting region 201, the raised parts 302 on the board mounting region 301, and the raised parts 402 on the upper main surface 400 of the busbar 4 may respectively be referred to as upper raised parts.

The wiring board 19 is mounted on the board mounting region 211 of the busbar 2, the insulating portion 51 between the busbar 2 and the busbar 4, the lower main surface 410 of the busbar 4, the insulating portion 52 between the busbar 4 and the busbar 3, and the board mounting region 311 of the busbar 3. Hereafter, the board mounting region 211, the insulating portion 51, the lower main surface 410 of the busbar 4, the insulating portion 52 and the board mounting region 311 on which the wiring board 19 is mounted may be collectively referred to as the lower board mounting region. Also, the raised parts 212 on the board mounting region 211, the raised parts 312 on the board mounting region 311, and the raised parts 412 on the lower main surface 410 of the busbar 4 may respectively be referred to as lower raised parts.

Figure 18:
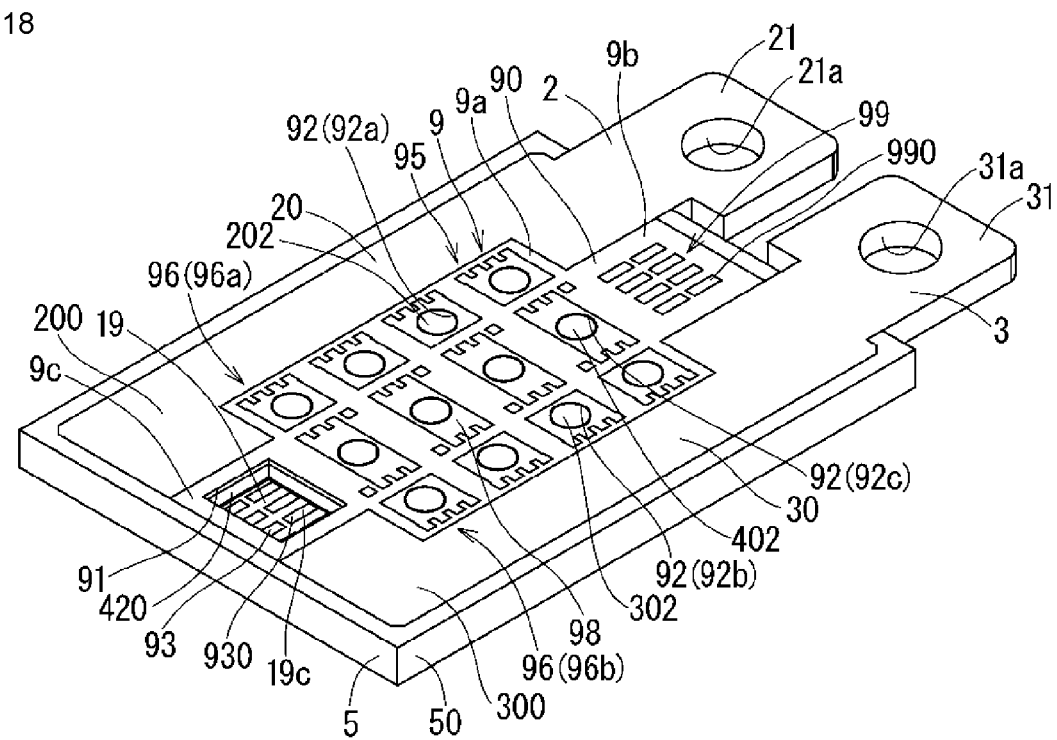
FIG. 18 is a schematic perspective view showing an example of the configuration of part of the circuit structure.
Figure 19:
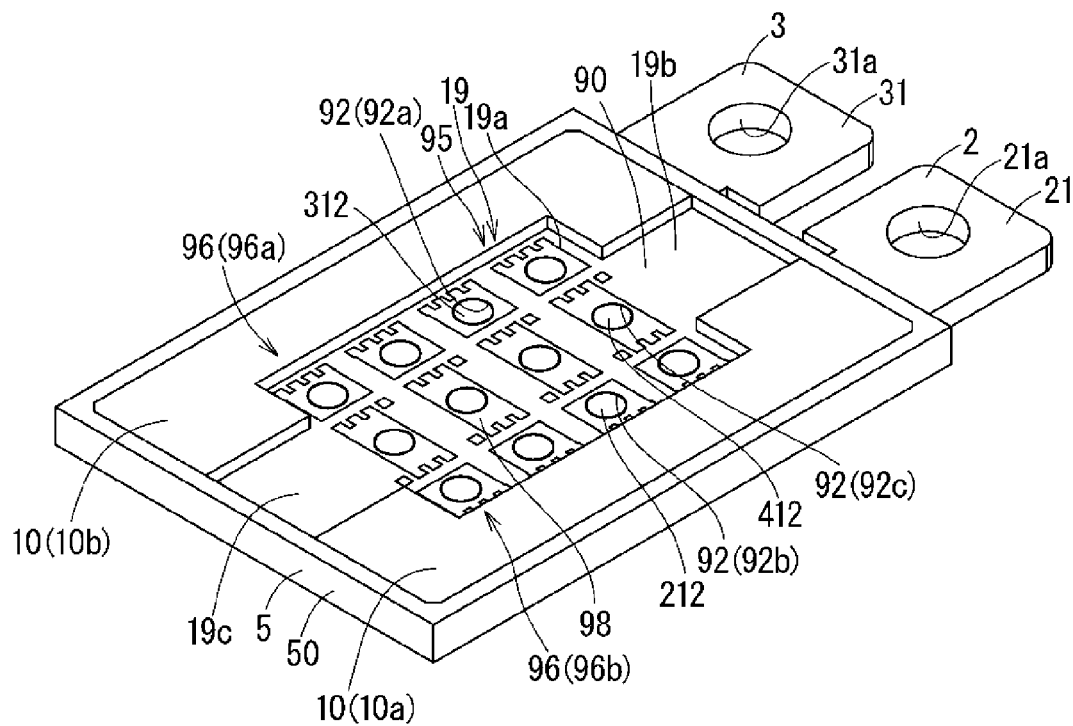
FIG. 19 is a schematic perspective view showing an example of the configuration of part of the circuit structure.

FIG. 18 is a diagram illustrating an example of a state in which the wiring board 9 is mounted on the upper board mounting region. FIG. 19 is a diagram illustrating an example of a state in which the wiring board 19 is mounted on the lower board mounting region.

As shown in FIG. 18 and other diagrams, the wiring board 9 is provided on the upper board mounting region, such that the back main surface thereof opposes the upper board mounting region. The wiring board 9 is fixed to the upper board mounting region, using a bonding material 12a (see FIG. 6), for example. The bonding material 12a may be an adhesive sheet or may be another member.

When the wiring board 9 is mounted on the upper board mounting region, the plurality of upper raised parts are respectively inserted into the plurality of open holes 92 in the wiring board 9. Specifically, the plurality of raised parts 202 of the busbar 2 are respectively inserted into the plurality of open holes 92a in the wiring board 9. Also, the plurality of raised parts 302 of the busbar 3 are respectively inserted into the plurality of open holes 92b in the wiring board 9. Also, the plurality of raised parts 402 of the busbar 4 are respectively inserted into the plurality of open holes 92c in the wiring board 9.

In the state where the wiring board 9 is mounted on the upper board mounting region, the raised parts 202 protrude inside the open holes 92a from the busbar 2, the raised parts 302 protrude inside the open holes 92b from the busbar 3, and the raised parts 402 protrude inside the open holes 92c from the busbar 4. The diameter of the upper raised parts is set slightly smaller than the diameter of the open holes 92. The upper raised parts can also be said to fit into the open holes 92.

The front main surface of the insulating board 90 of the wiring board 9 mounted on the upper board mounting region is flush with regions of the upper main surface 200 of the busbar 2 other than the board mounting region 201 and regions of the upper main surface 300 of the busbar 3 other than the board mounting region 301. Note that the surface of the conductive layer 95 on the insulating board 90 may lie in the same plane as regions of the upper main surface 200 of the busbar 2 other than the board mounting region 201 and regions of the upper main surface 300 of the busbar 3 other than the board mounting region 301.

The circular end faces of the upper raised parts inside the open holes 92 lie in the same plane as the flat surface of the conductive layer 95 on the insulating board 90, for example. Accordingly, the end faces of the raised parts 202 protruding inside the open holes 92a are flush with the surfaces of the conductive regions 96a around the open holes 92a. Also, the end faces of the raised parts 302 protruding inside the open holes 92b are flush with the surfaces of the conductive regions 96b around the open holes 92b. Furthermore, the end faces of the raised parts 402 protruding inside the open holes 92c are flush with the surfaces of the extension regions 98 around the open holes 92c. Note that the end faces of the upper raised parts may lie in the same plane as the front main surface of the insulating board 90.

Also, the wiring board 9 is provided on the upper board mounting region, such that an opening 91 provided in the third portion 9c opposes the opening 420 provided in the end portion of the busbar 4. The opening 91 and the opening 420 thereby communicate to constitute a single opening.

As shown in FIG. 19 and other diagrams, the wiring board 19 is provided on the lower board mounting region, such that the back main surface thereof opposes the lower board mounting region. The wiring board 19 is fixed to the lower board mounting region, using a bonding material 12b (see FIG. 6), for example. The bonding material 12b may be an adhesive sheet or may be another member.

When the wiring board 19 is mounted on the lower board mounting region, the plurality of lower raised parts are respectively inserted into the plurality of open holes 92 in the wiring board 19. Specifically, the plurality of raised parts 212 of the busbar 2 are respectively inserted into the plurality of open holes 92b in the wiring board 19. Also, the plurality of raised parts 312 of the busbar 3 are respectively inserted into the plurality of open holes 92a in the wiring board 19. Furthermore, the plurality of raised parts 412 of the busbar 4 are respectively inserted into the plurality of open holes 92c in the wiring board 19. The diameter of the lower raised parts is set slightly smaller than the diameter of the open holes 92.

The front main surface of the insulating board 90 of the wiring board 19 mounted on the lower board mounting region is flush with regions of the lower main surface 210 of the busbar 2 other than the board mounting region 211 and regions of the lower main surface 310 of the busbar 3 other than the board mounting region 311. Note that the surface of the conductive layer 95 of the wiring board 19 may lie in the same plane as regions of the lower main surface 210 of the busbar 2 other than the board mounting region 211 and regions of the lower main surface 310 of the busbar 3 other than the board mounting region 311.

The end faces of the lower raised parts protruding inside the open holes 92 lie in the same plane as the surface of the conductive layer 95, for example. Accordingly, the end faces of the raised parts 212 protruding inside the open holes 92b are flush with the surfaces of the conductive regions 96b around the open holes 92b. Also, the end faces of the raised parts 312 protruding inside the open holes 92a are flush with the surfaces of the conductive regions 96a around the open holes 92a. Furthermore, the end faces of the raised parts 412 protruding inside the open holes 92c are flush with the surfaces of the extension regions 98 around the open holes 92c. Note that the end faces of the lower raised parts may lie in the same plane as the front main surface of the insulating board 90.

The front main surface of the wiring board 19 mounted on the lower board mounting region is slightly lower than the exposed main surfaces of the heat dissipation members 10a and 10b. On the surface on the wiring board 19 side of the structure shown in FIG. 19, a depression surrounded by the frame-like insulating portion 50 of the insulating member 5 and the heat dissipation members 10a and 10b is formed. The plurality of MOSFETs 26 and the plurality of conductive pieces 28 are disposed in this depression.

Also, the wiring board 19 is provided on the lower board mounting region, such that the conductive region 93 provided in the third portion 19c opposes the opening 420 in the busbar 4. As a result, when the busbars 2, 3 and 4 and the insulating member 5 on which the wiring boards 9 and 19 are installed are viewed from the wiring board 9 side, the conductive region 93 of the wiring board 19 is exposed through the openings 91 and 420, as shown in FIGS. 9, 18 and other diagrams.

Regarding Conductive Pieces

As shown in FIGS. 1, 4, 5, 6 and other diagrams, the plurality of conductive pieces 18 on the wiring board 9 are respectively bonded to the plurality of raised parts 402 that are exposed through the front main surface of the wiring board 9. Also, the plurality of conductive pieces 18 are respectively bonded to the plurality of extension regions 98 of the wiring board 9. The conductive pieces 18 are provided on the wiring board 9 so as to cover the end faces of the raised parts 402 protruding inside the open holes 92c in the wiring board 9 and a peripheral portion of the open holes 92c. The conductive pieces 18 cover the opening edges of the open holes 92c (specifically, the opening edges on the front main surface side of the wiring board 9). The thickness of the conductive pieces 18 may be set from 0.2 mm to 0.5 mm inclusive, for example.

The conductive pieces 18 are bonded by a conductive bonding material 101 to the end faces of the raised parts 402 protruding inside the open holes 92c and to the extension regions 98 around the open holes 92c (see FIG. 6). Solder, for example, is employed as the conductive bonding material 101. The conductive bonding material 101 bonds the back surfaces of the conductive pieces 18 to the end faces of the raised parts 402 and the surfaces of the extension regions 98, and bonds the peripheral end faces of the conductive pieces 18 to the surfaces of the extension regions 98. The conductive bonding material 101 includes portions located between the raised parts 402 and the conductive pieces 18 and between the extension regions 98 and the conductive pieces 18. Also, the conductive bonding material 101 enters the open holes 92c, for example. In this case, the conductive region on the inner peripheral surface of the open holes 92c which are through holes is bonded to the raised parts 402 protruding inside the open holes 92c by the conductive bonding material 101.

The plurality of conductive pieces 18 are respectively provided in correspondence with the plurality of first FET pairs. Each conductive piece 18 is provided in order to reduce electrical resistance between the source terminals 62 of the MOSFETs 16a and 16b constituting the first FET pair corresponding thereto and the busbar 4.

As shown in FIGS. 3, 6, 7, 8 and other diagrams, the plurality of conductive pieces 28 on the wiring board 19 are respectively bonded to the plurality of raised parts 412 that are exposed through the front main surface of the wiring board 19. Also, the plurality of conductive pieces 28 are respectively bonded to the plurality of extension regions 98 of the wiring board 19. The conductive pieces 28 are provided on the wiring board 19 so as to cover the end faces of the raised parts 412 protruding inside the open holes 92c in the wiring board 19 and a peripheral portion of the open holes 92c. The conductive pieces 28 cover the opening edges of the open holes 92c (specifically, the opening edges on the front main surface side of the wiring board 19). The thickness of the conductive pieces 28 may be set from 0.2 mm to 0.5 mm inclusive, for example.

The conductive pieces 28 are bonded by a conductive bonding material 102 to the end faces of the raised parts 412 protruding inside the open holes 92c and the extension regions 98 around the open holes 92c (see FIG. 6). Solder, for example, is employed as the conductive bonding material 102. For example, the conductive pieces 28 are bonded by the conductive bonding material 102 to the raised parts 412 and the extension regions 98, in a similar manner to the case where the conductive pieces 18 are bonded by the conductive bonding material 101 to the raised parts 402 and the extension regions 98.

The plurality of conductive pieces 28 are respectively provided in correspondence with the plurality of second FET pairs. Each conductive piece 28 is provided in order to reduce electrical resistance between the source terminals 62 of the MOSFETs 26a and 26b constituting the second FET pair corresponding thereto and the busbar 4.

Example of Mounting Electronic Components

As shown in FIG. 6 and other diagrams, the MOSFETs 16a on the upper side are provided on the wiring board 9, so as to straddle between both the busbar 2 and the busbar 4, for example. Given that the insulating portion 51 is located between the busbar 2 and the busbar 4, the MOSFETs 16a are located on the busbars 2 and 4 so as to straddle the insulating portion 51.

The drain terminals 63 of the plurality of MOSFETs 16a are respectively bonded to the lands 962 of the plurality of conductive regions 96a. The plurality of protruding parts 63a of the drain terminals 63 of the MOSFETs 16a are respectively bonded to the plurality of protruding parts 962a of the lands 962.

The drain terminal 63 of each MOSFET 16a is also bonded to the raised part 202 exposed through the land 962 to which that drain terminal 63 is bonded. The drain terminals 63 of the MOSFETs 16a cover the end faces of the raised parts 202 protruding inside the open holes 92a in the wiring board 9 and a peripheral portion of the open holes 92a. The drain terminals 63 of the MOSFETs 16a cover the opening edges of the open holes 92a (specifically, the opening edges on the front main surface side of the wiring board 9).

The drain terminal 63 of each MOSFET 16a is bonded by a conductive bonding material 111 to the land 962 and the end face of the raised part 202 exposed through that land 962 (see FIG. 6). Solder, for example, is employed as the conductive bonding material 111. The conductive bonding material 111 bonds the back surfaces of the drain terminals 63 to the surfaces of the lands 962 and the end faces of the raised parts 202, and bonds the end faces of the drain terminals 63 to the surfaces of the lands 962. The conductive bonding material 111 includes portions located between the raised parts 202 and the drain terminals 63 and between the lands 962 and the drain terminals 63. Also, the conductive bonding material 111 enters the open holes 92a, for example. The conductive region on the inner peripheral surface of the open holes 92a which are through holes is bonded to the raised parts 202 protruding inside the open holes 92a by the conductive bonding material 111. Due to the drain terminals 63 of the MOSFETs 16a being bonded to the raised parts 202, the drain terminals 63 of the MOSFETs 16a are electrically connected to the busbar 2. The voltage that is input to the input terminal part 21 of the busbar 2 is input to the drain terminals 63 of the MOSFETs 16b through the busbar 2.

The gate terminals 61 of the plurality of MOSFETs 16a are respectively bonded by a conductive bonding material to the lands 960 of the plurality of conductive regions 96a. Solder, for example, is employed as the conductive bonding material. The conductive bonding material bonds the back surfaces and end faces of the gate terminals 61 to the lands 960, for example. The conductive bonding material includes portions located between the gate terminals 61 and the lands 960. The gate terminal 61 of each MOSFET 16a is electrically connected to the connection terminal 70 of the connector 7a through the land 960 of the conductive region 96a, the first wiring joined to that land 960, and the land 990 of the conductive region 99 joined to that first wiring. Switching control of the MOSFETs 16a is performed externally through the connector 7a.

The plurality of source terminals 62 of each MOSFET 16a are respectively bonded by a conductive bonding material 112 to the plurality of lands 961 of the conductive region 96a corresponding to that MOSFET 16a (see FIG. 6). Solder, for example, is employed as the conductive bonding material 112. The conductive bonding material 112 bonds the back surfaces and end faces of the source terminals 62 to the lands 961, for example. The conductive bonding material 112 includes portions located between the source terminals 62 and the lands 961. Each source terminal 62 is electrically connected to the relay busbar 4, through the land 961, the extension region 98 joined to that land 961, the conductive piece 18 bonded to that extension region 98, and the conductive raised part 402 to which that conductive piece 18 is bonded. The conductive pieces 18 function as relay terminals that electrically connect the source terminals 62 of the MOSFETs 16a to the raised parts 402.

Also, the MOSFETs 16b on the upper side are provided on the wiring board 9 so as to straddle between both the busbar 3 and the busbar 4, for example, as shown in FIG. 6 and other diagrams. Given that the insulating portion 52 is located between the busbar 3 and the busbar 4, the MOSFETs 16b are located on the busbars 3 and 4 so as to straddle the insulating portion 52.

The drain terminals 63 of the plurality of MOSFETs 16b are respectively bonded to the lands 962 of the plurality of conductive regions 96b. The drain terminal 63 of each MOSFET 16b is also bonded to the raised part 302 exposed through the land 962 to which that drain terminal 63 is bonded. The drain terminal 63 of each MOSFET 16b is bonded by a conductive bonding material 113 to the land 962 and the end face of the raised part 302 exposed through that land 962 (see FIG. 6). Solder, for example, is employed as the conductive bonding material 113. For example, the drain terminals 63 of the MOSFETs 16b are bonded by the conductive bonding material 113 to the raised parts 302 and the lands 962, in a similar manner to the case where the drain terminals 63 of the MOSFETs 16a are bonded by the conductive bonding material 111 to the raised parts 202 and the lands 962.

The gate terminals 61 of the plurality of MOSFETs 16b are respectively bonded by a conductive bonding material to the lands 960 of the plurality of conductive regions 96b. Solder, for example, is employed as the conductive bonding material. The gate terminal 61 of each MOSFET 16b is electrically connected to the connection terminal 70 of the connector 7a through the land 960 of the conductive region 96b, the first wiring joined to that land 960, and the land 990 of the conductive region 99 joined to that first wiring. Switching control of the MOSFETs 16b is performed externally through the connector 7a. For example, the gate terminals 61 of the MOSFETs 16b are bonded to the lands 960, in a similar manner to the case where the gate terminals 61 of the MOSFETs 16a are bonded to the lands 960.

The plurality of source terminals 62 of each MOSFET 16b are respectively bonded by a conductive bonding material 114 to the plurality of lands 961 of the conductive region 96b corresponding to that MOSFET 16b (see FIG. 6). Solder, for example, is employed as the conductive bonding material 114. Each source terminal 62 of the MOSFET 16b is electrically connected to the relay busbar 4, through the land 961, the extension region 98 joined to that land 961, the conductive piece 18 bonded to that extension region 98, and the conductive raised part 402 to which that conductive piece 18 is bonded. The conductive pieces 18 function as relay terminals that electrically connect the source terminals 62 of the MOSFETs 16b to the raised parts 402. The source terminals 62 of the MOSFETs 16b are electrically connected to the source terminals 62 of the MOSFET 16a through the relay busbar 4. For example, the source terminals 62 of the MOSFETs 16b are bonded to the lands 961 by the conductive bonding material 114, in a similar manner to the case where the source terminals 62 of the MOSFETs 16a are bonded to the lands 961 by the conductive bonding material 112.

The MOSFETs 26a on the lower side are provided on the wiring board 19, so as to straddle between both the busbar 2 and the busbar 4, similarly to the MOSFETs 16a on the upper side, for example.

The drain terminals 63 of the plurality of MOSFETs 26a are respectively bonded to the lands 962 of the plurality of conductive regions 96b of the wiring board 19. The drain terminal 63 of each MOSFET 26a is also bonded to the raised part 212 exposed through the land 962 to which that drain terminal 63 is bonded. The drain terminal 63 of each MOSFET 26a is bonded by a conductive bonding material 115 to the land 962 and the end face of the raised part 212 exposed through that land 962 (see FIG. 6). Solder, for example, is employed as the conductive bonding material 115. Due to the drain terminals 63 of the MOSFETs 26a being bonded to the raised parts 212, the drain terminals 63 of the MOSFET 26a are electrically connected to the busbar 2. The voltage that is input to the input terminal part 21 of the busbar 2 is input to the drain terminals 63 of the MOSFETs 26a through the busbar 2. For example, the drain terminals 63 of the MOSFETs 26a are bonded by the conductive bonding material 115 to the raised parts 212 and the lands 962, in a similar manner to the case where the drain terminals 63 of the MOSFETs 16a are bonded by the conductive bonding material 111 to the raised parts 202 and the lands 962.

The gate terminals 61 of the plurality of MOSFETs 26a are respectively bonded by a conductive bonding material to the lands 960 of the plurality of conductive regions 96b of the wiring board 19. Solder, for example, is employed as the conductive bonding material. The gate terminal 61 of each MOSFET 26a is electrically connected to the connection terminal 70 of the connector 7b through the land 960 of the conductive region 96b, the second wiring joined to that land 960, and the land 930 of the conductive region 93 joined to that second wiring. Switching control of the MOSFETs 26a is performed externally through the connector 7b. For example, the gate terminals 61 of the MOSFETs 26a are bonded to the lands 960, in a similar manner to the case where the gate terminals 61 of the MOSFETs 16a are bonded to the lands 960.

The plurality of source terminals 62 of each MOSFET 26a are respectively bonded by a conductive bonding material 116 to the plurality of lands 961 of the conductive region 96b corresponding to that MOSFET 26a (see FIG. 6). Solder, for example, is employed as the conductive bonding material 116. Each source terminal 62 of the MOSFET 26a is electrically connected to the relay busbar 4, through the land 961, the extension region 98 joined to that land 961, the conductive piece 28 bonded to that extension region 98, and the conductive raised part 412 to which that conductive piece 28 is bonded. The conductive pieces 28 function as relay terminals that electrically connect the source terminals 62 of the MOSFETs 26a to the raised parts 412. For example, the source terminals 62 of the MOSFETs 26a are bonded to the lands 961 by the conductive bonding material 116, in a similar manner to the case where the source terminals 62 of the MOSFETs 16a are bonded to the lands 961 by the conductive bonding material 112.

The MOSFETs 26b are provided on the wiring board 19, so as to straddle between both the busbar 3 and the busbar 4, for example, as shown in FIG. 6 and other diagrams. The drain terminals 63 of the plurality of MOSFETs 26b are respectively bonded to the lands 962 of the plurality of conductive regions 96a. The drain terminal 63 of each MOSFET 26b is also bonded to the raised part 312 exposed through the land 962 to which that drain terminal 63 is bonded. The drain terminal 63 of each MOSFET 26b is bonded by a conductive bonding material 117 to the land 962 and the end face of the raised part 312 exposed through that land 962 (see FIG. 6). Solder, for example, is employed as the conductive bonding material 117. Due to the drain terminals 63 of the MOSFETs 26b being bonded to the raised parts 312, the drain terminals 63 of the MOSFETs 26b are electrically connected to the busbar 3. The output voltage of the drain terminals 63 of the MOSFETs 26b is output externally from the output terminal part 31 of the busbar 3. For example, the drain terminals 63 of the MOSFETs 26b are bonded by the conductive bonding material 117 to the raised parts 312 and the lands 962, in a similar manner to the case where the drain terminals 63 of the MOSFETs 16a are bonded to the raised parts 202 and the lands 962 by the conductive bonding material 111.

The gate terminals 61 of the plurality of MOSFETs 26b are respectively bonded by a conductive bonding material to the lands 960 of the plurality of conductive regions 96a. Solder, for example, is employed as the conductive bonding material. The gate terminal 61 of each MOSFET 16b is electrically connected to the connection terminal 70 of the connector 7b through the land 960 of the conductive region 96a, the second wiring joined to that land 960, and the land 930 of the conductive region 93 joined to that second wiring. Switching control of the MOSFETs 26b is performed externally through the connector 7b. For example, the gate terminals 61 of the MOSFETs 26b are bonded to the lands 960, in a similar manner to the case where the gate terminals 61 of the MOSFETs 16a are bonded to the lands 960.

The plurality of source terminals 62 of each MOSFET 26b are respectively bonded by a conductive bonding material 118 to the plurality of lands 961 of the conductive region 96a corresponding to that MOSFET 26b (see FIG. 6). Solder, for example, is employed as the conductive bonding material 118. Each source terminal 62 is electrically connected to the relay busbar 4 through the land 961, the extension region 98 joined to that land 961, the conductive piece 28 bonded to that extension region 98, and the conductive raised part 412 to which that conductive piece 28 is bonded. The conductive pieces 28 function as relay terminals that electrically connect the source terminals 62 of the MOSFETs 26b to the raised parts 412. The source terminals 62 of the MOSFETs 26b are electrically connected to the source terminals 62 of the MOSFET 26a through the relay busbar 4. For example, the source terminals 62 of the MOSFETs 26b are bonded to the lands 961 by the conductive bonding material 118, in a similar manner to the case where the source terminals 62 of the MOSFETs 16a are bonded to the lands 961 by the conductive bonding material 112.

Example Configuration of Molded Resin

The molded resin 11 is constituted by a thermoset resin such as epoxy resin, for example. The coefficient of linear expansion of the molded resin 11 is set smaller than the coefficient of linear expansion of the insulating member 5, for example. The coefficient of linear expansion of the molded resin 11 constituted by epoxy resin is 30 ppm/° C., which is smaller than the coefficient of linear expansion (e.g., 40 ppm/° C.) of the insulating member 5 constituted by PPS, for example.

As shown in FIGS. 2, 3 and other diagrams, the molded resin 11 is provided on the front main surface of the wiring board 19 so as to cover the MOSFETs 26 and the conductive pieces 28. The molded resin 11 covers the front main surface of the wiring board 19. The exposed surface of the molded resin 11 is flush and continuous with the exposed surfaces of the heat dissipation members 10, for example. The molded resin 11 protects the inside of the circuit structure 1, and reduces the possibility of water getting into the circuit structure 1, for example.

Example of Manufacturing Method of Circuit Structure

Figure 20:
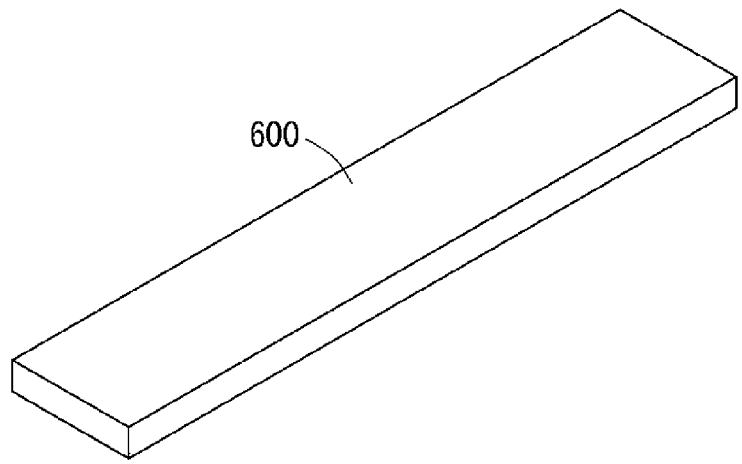
FIG. 20 is a schematic perspective view for describing an example of a manufacturing method of the circuit structure.
Figure 21:
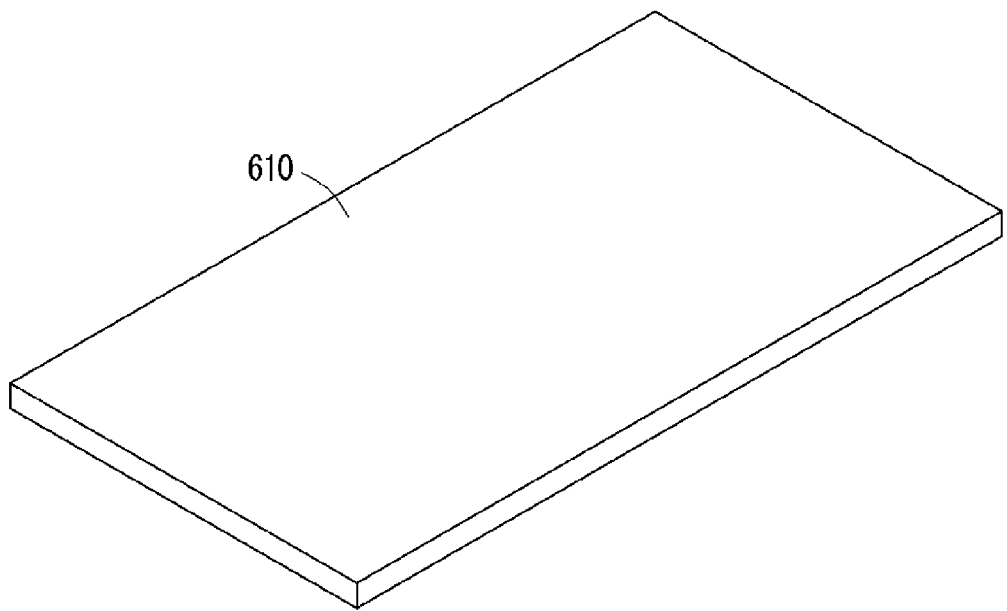
FIG. 21 is a schematic perspective view for describing an example of the manufacturing method of the circuit structure.

In the case of manufacturing the circuit structure 1 having a configuration such as the above, first, a metal plate 600 for producing the busbar 4 and a metal plate 610 for producing the busbars 2 and 3 are prepared. FIG. 20 is a schematic perspective view showing an example of the metal plate 600. FIG. 21 is a schematic perspective view showing an example of the metal plate 610.

Next, the metal plate 600 is molded into a predetermined shape by cold forging or cutting, for example. The plurality of raised parts 402 are then provided on one main surface of the molded metal plate 600, and the plurality of raised parts 412 are provided on the other main surface. The opening 420 is then provided in the molded metal plate 600. The relay busbar 4 shown in FIGS. 22 to 24 is thereby completed.

Figure 22:
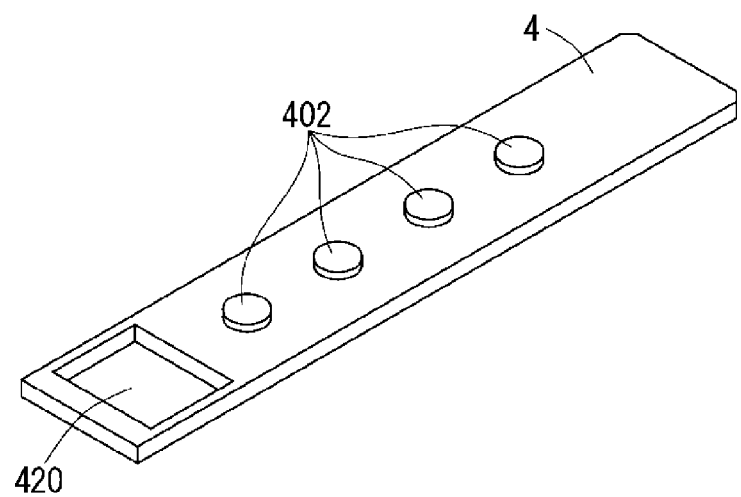
FIG. 22 is a schematic perspective view for describing an example of the manufacturing method of the circuit structure.
Figure 23:
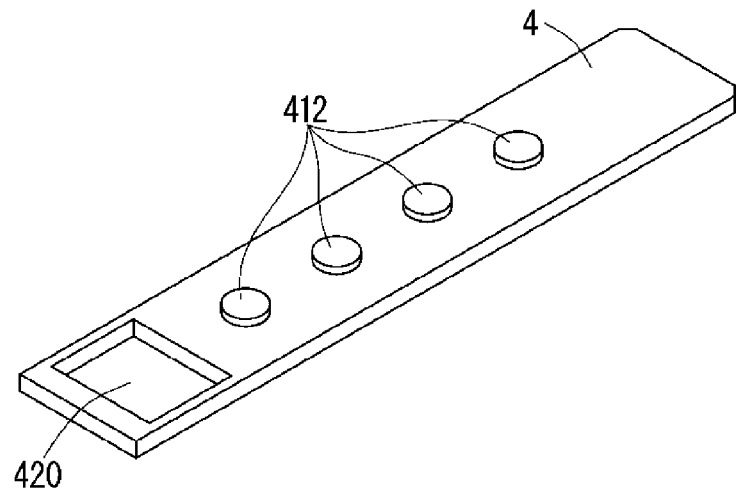
FIG. 23 is a schematic perspective view for describing an example of the manufacturing method of the circuit structure.
Figure 24:
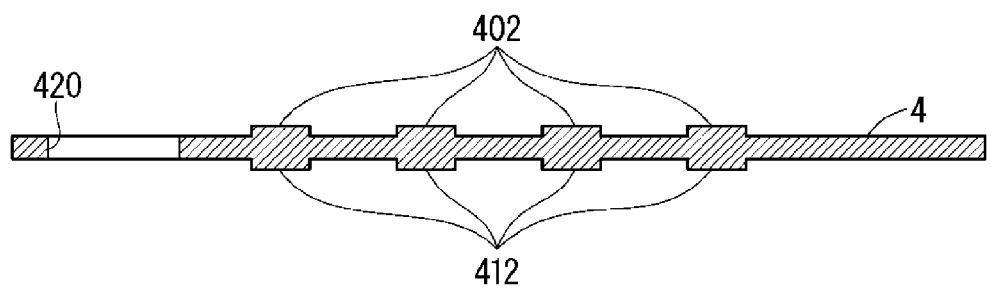
FIG. 24 is a schematic perspective view for describing an example of the manufacturing method of the circuit structure.

FIGS. 22 and 23 are schematic perspective views showing the relay busbar 4. FIG. 24 is a schematic diagram showing a cross-sectional structure of the relay busbar 4 in the long direction thereof.

Figure 25:
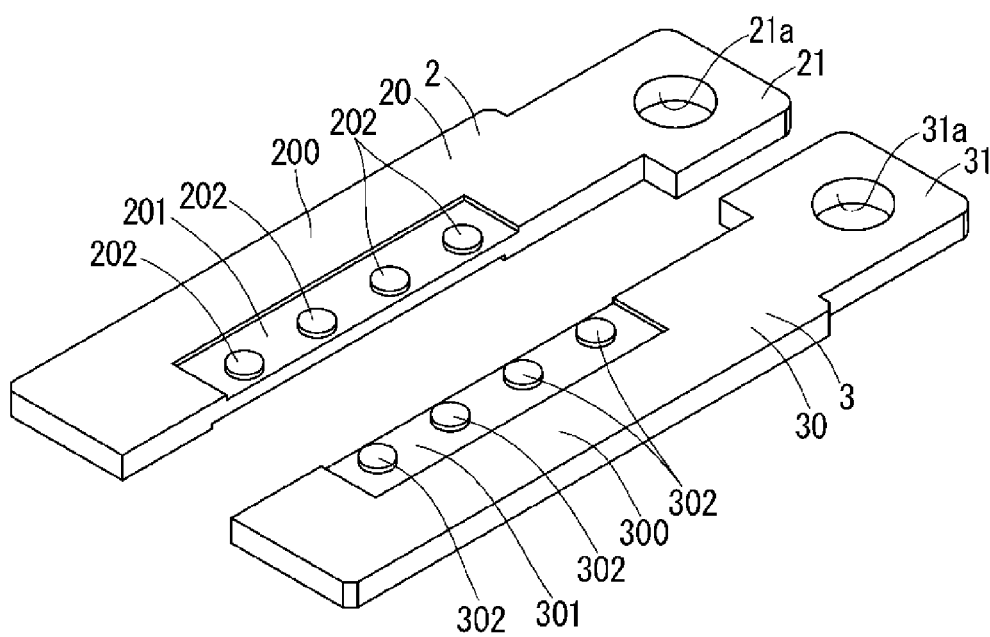
FIG. 25 is a schematic perspective view for describing an example of the manufacturing method of the circuit structure.
Figure 26:
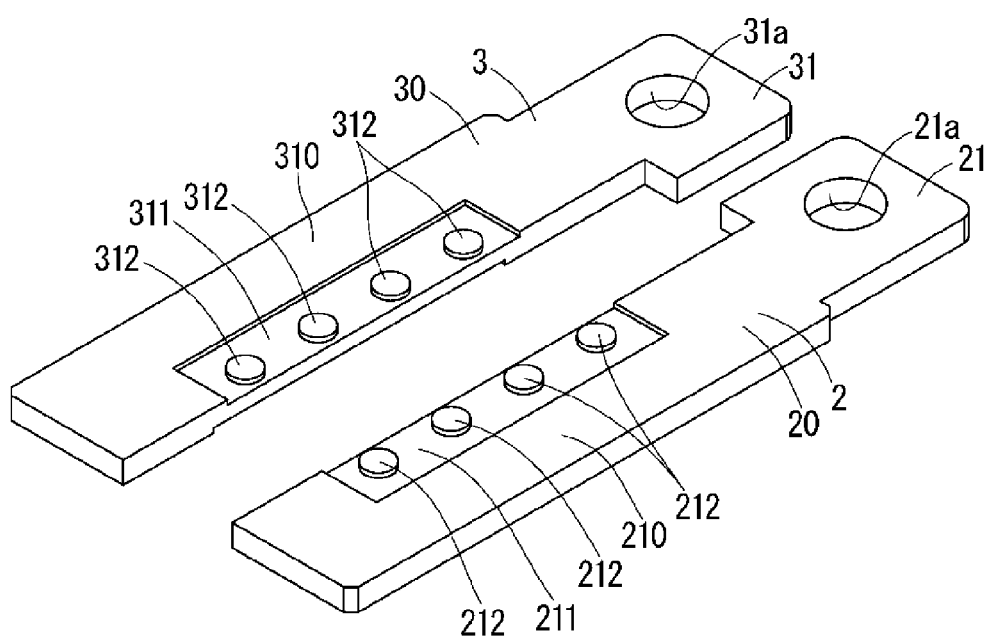
FIG. 26 is a schematic perspective view for describing an example of the manufacturing method of the circuit structure.

Also, the metal plate 610 is molded into a predetermined shape by cold forging or cutting and a molded metal plate forming the basis of the busbar 2 and a molded metal plate forming the basis of the busbar 3 are produced, for example. Next, the open hole 21a is provided in the metal plate forming the basis of the busbar 2. Also, the plurality of raised parts 202 are provided on one main surface of the metal plate forming the basis of the busbar 2, and the plurality of raised parts 212 are provided on the other main surface. The busbar 2 shown in FIGS. 25 and 26 is thereby completed. Similarly, the open hole 31a is provided in the metal plate forming the basis of the busbar 3. Also, the plurality of raised parts 302 are provided on one main surface of the metal plate forming the basis of the busbar 3, and the plurality of raised parts 312 are provided on the other main surface. The busbar 3 shown in FIGS. 25 and 26 is thereby completed.

Figure 27:
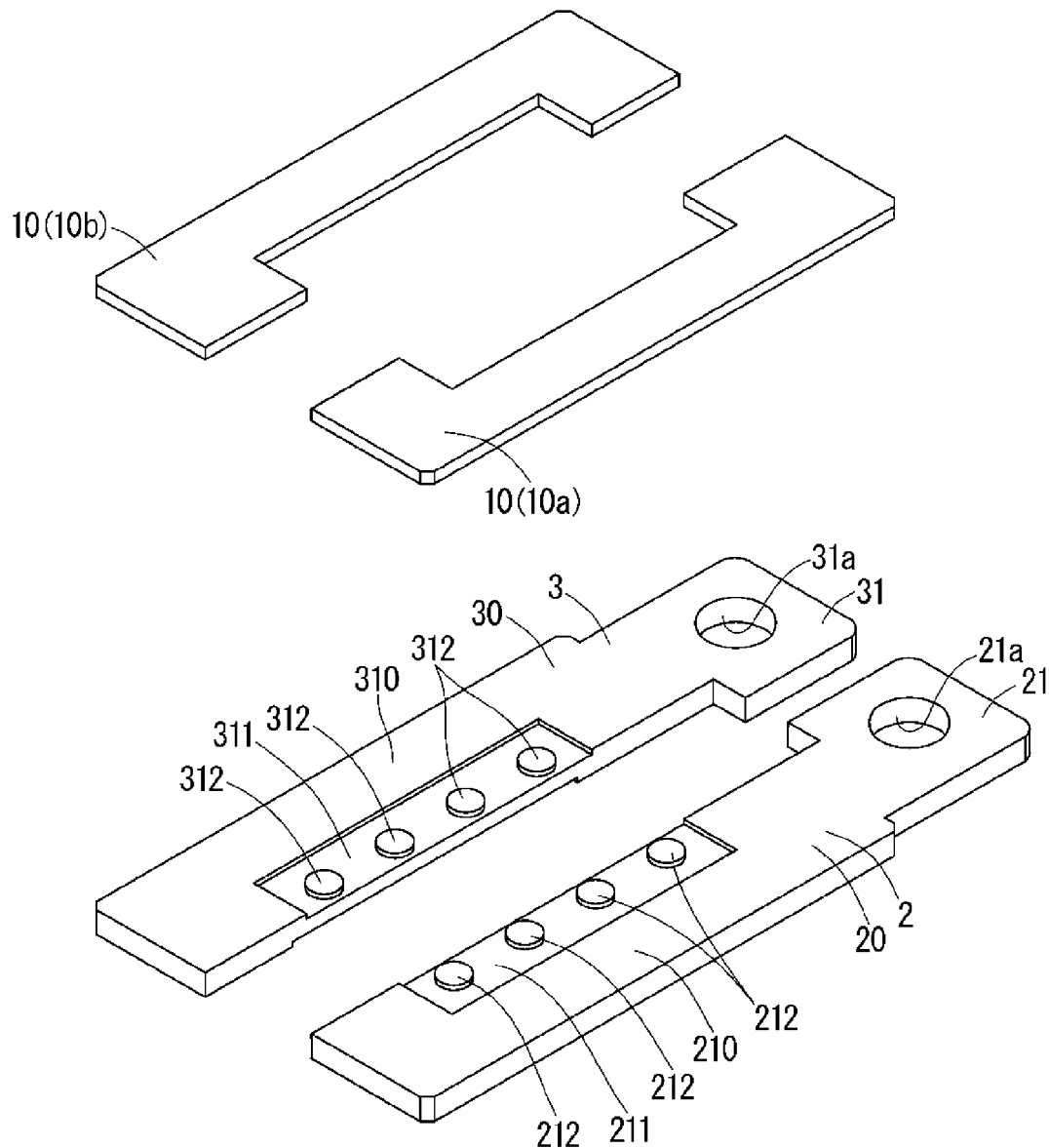
FIG. 27 is a schematic perspective view for describing an example of the manufacturing method of the circuit structure.
Figure 28:
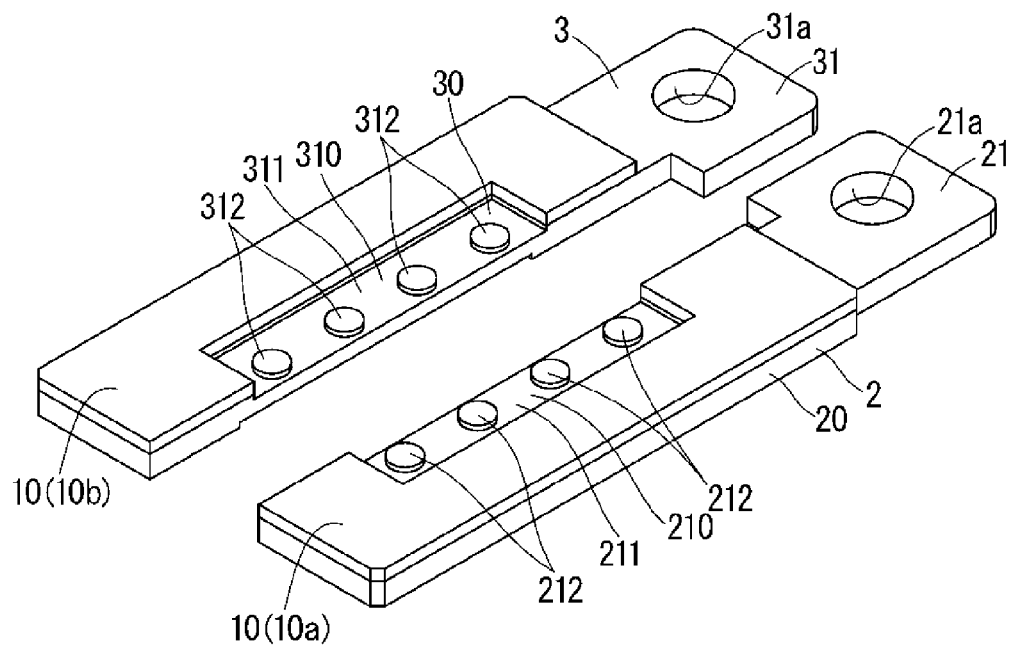
FIG. 28 is a schematic perspective view for describing an example of the manufacturing method of the circuit structure.
Figure 29:
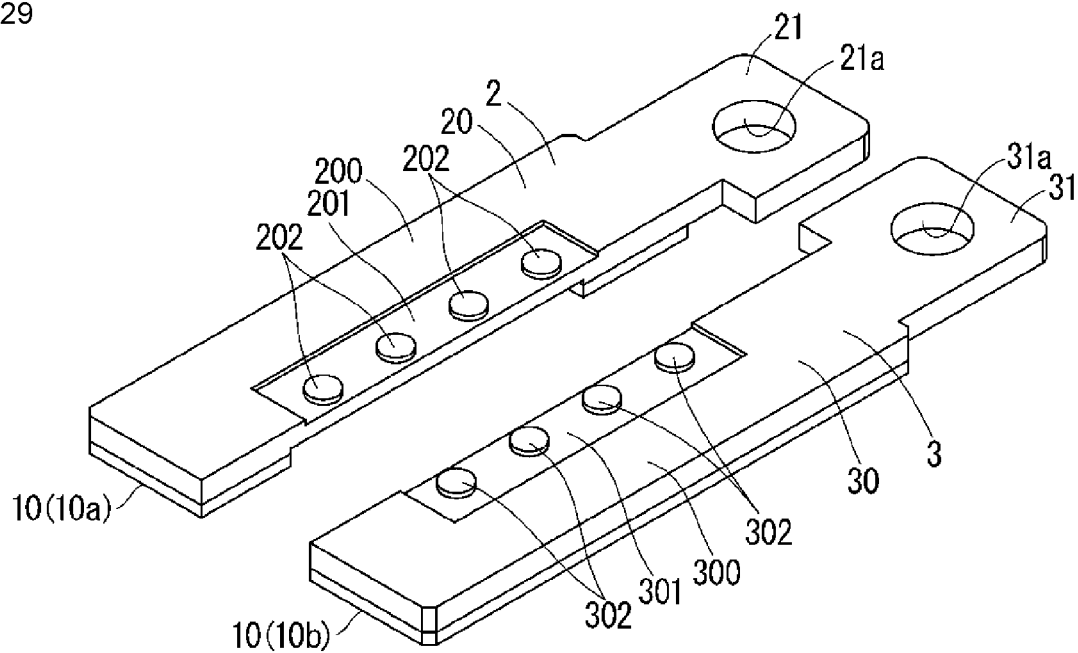
FIG. 29 is a schematic perspective view for describing an example of the manufacturing method of the circuit structure.

Next, as shown in FIG. 27, the heat dissipation members 10a and 10b are prepared. Next, the heat dissipation member 10a is diffusion-bonded to the main surface 210 of the busbar 2 using pressure treatment and heat treatment, for example. Also, the heat dissipation member 10b is diffusion-bonded to the main surface 310 of the busbar 3 using pressure treatment and heat treatment, for example. The structure shown in FIGS. 28 and 29 is thereby obtained.

Figure 30:
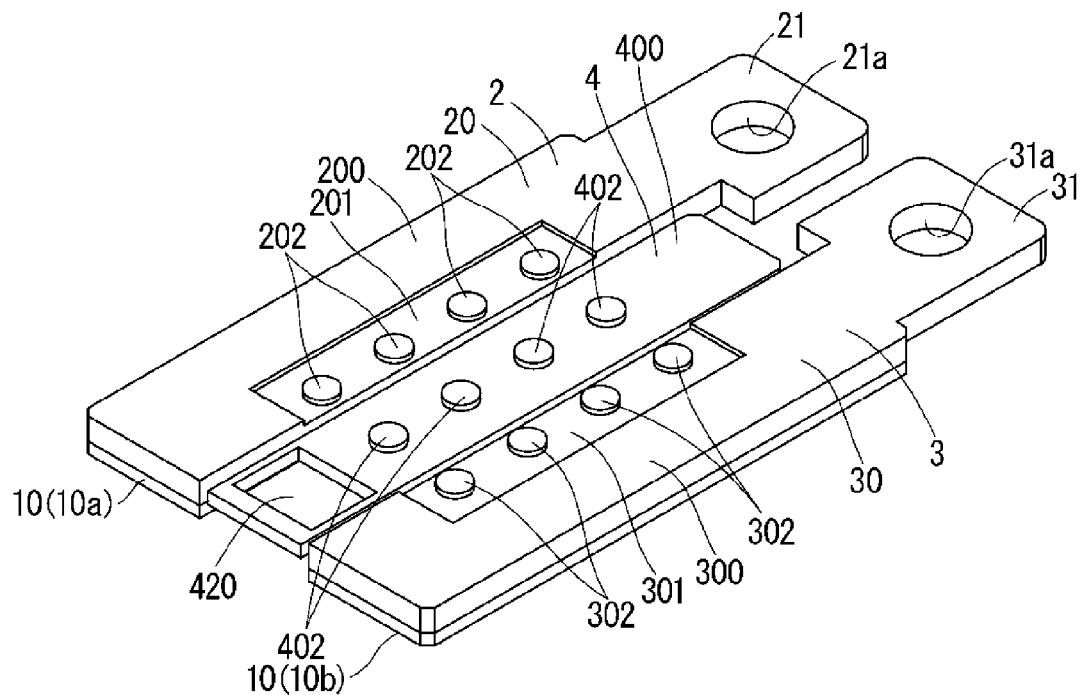
FIG. 30 is a schematic perspective view for describing an example of the manufacturing method of the circuit structure.
Figure 31:
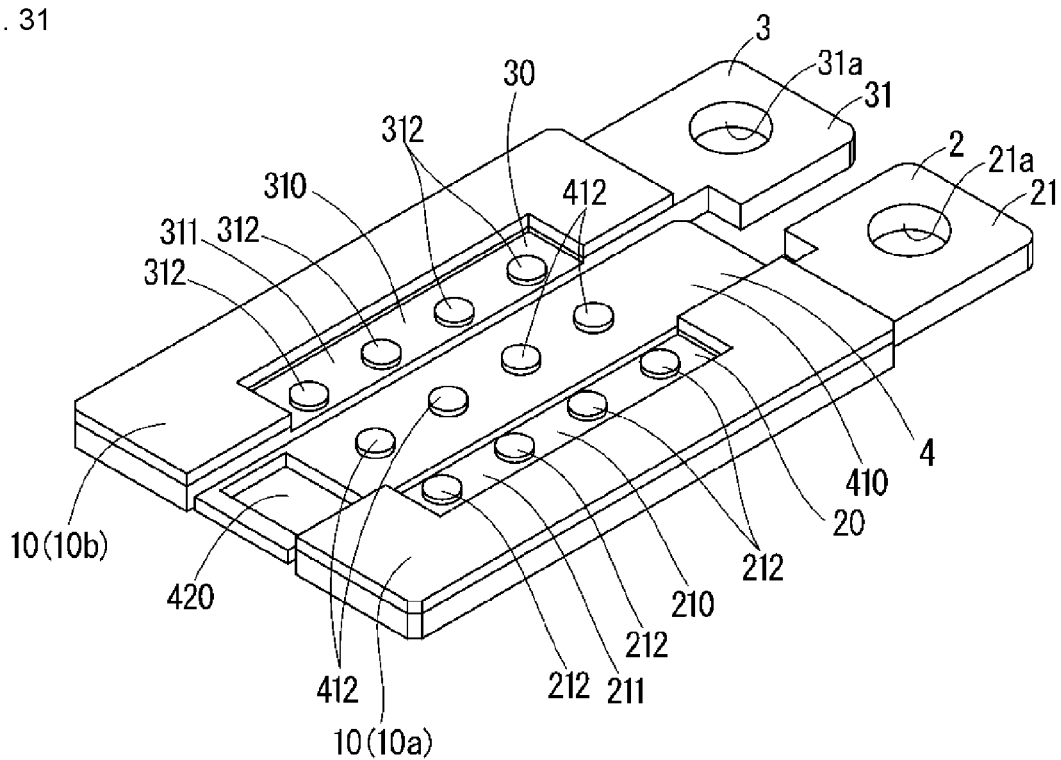
FIG. 31 is a schematic perspective view for describing an example of the manufacturing method of the circuit structure.

Next, as shown in FIGS. 30 and 31, the busbars 2, 3 and 4 and the heat dissipation members 10a and 10b are disposed in a mold for insert molding. In FIGS. 30 and 31, illustration of the mold for insert molding is omitted. A thermoplastic resin having excellent heat resistance such as PPS is then injected into the mold for insert molding by an injection molding machine, and the busbars 2, 3 and 4 and the heat dissipation members 10a and 10b are molded as one piece with the resin. As shown in FIGS. 10, 11, 13 and 14 referred to above, an integrally molded article in which the busbars 2, 3 and 4 and the heat dissipation members 10a and 10b are molded as one piece with the insulating member 5 is thereby obtained.

Next, the wiring board 9 is fixed by the bonding material 12a to the upper board mounting region provided in the produced integrally molded article. Also, the wiring board 19 is fixed by the bonding material 12b to the lower board mounting region provided in the produced integrally molded product. The structure shown in FIGS. 18 and 19 referred to above is thereby obtained.

Figure 32:
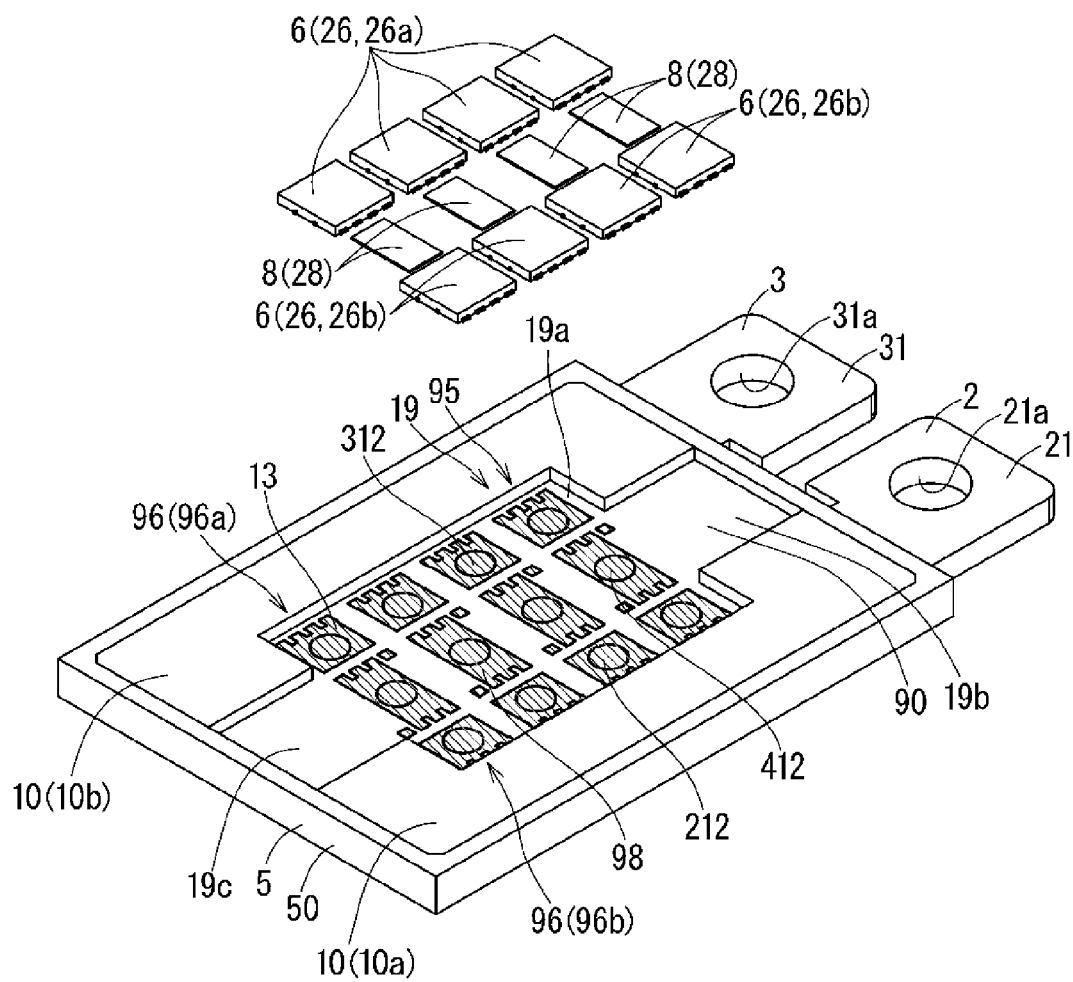
FIG. 32 is a schematic perspective view for describing an example of the manufacturing method of the circuit structure.

Next, as shown in FIG. 32, a solder paste 13 is applied to predetermined regions of the front main surface of the wiring board 19. In FIG. 32, the solder paste 13 is shaded. The plurality of MOSFETs 26 and the plurality of conductive pieces 28 are then soldered with a reflow method to the regions where the solder paste 13 was applied. The structure shown in FIGS. 3 and 7 referred to above is thereby obtained.

Next, a depression formed on the surface on the wiring board 19 side of the structure shown in FIGS. 3 and 7 and surrounded by the frame-like insulating portion 50 and the heat dissipation members 10a and 10b is filled with a thermoplastic resin and heat-cured. The molded resin 11 covering the wiring board 19, the MOSFETs 26 and the conductive pieces 28 is thereby formed (see FIG. 2).

Figure 33:
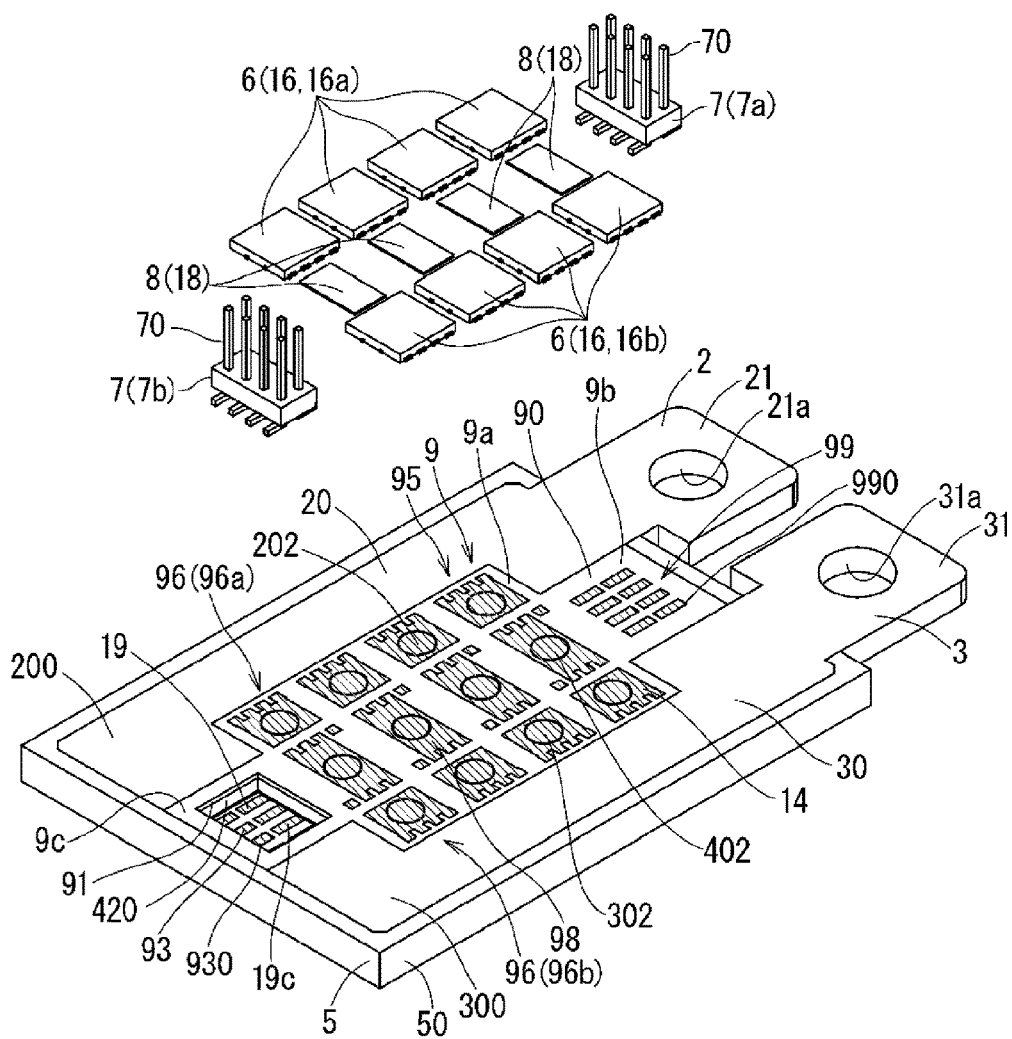
FIG. 33 is a schematic perspective view for describing an example of the manufacturing method of the circuit structure.

Next, as shown in FIG. 33, a solder paste 14 is applied to predetermined regions of the front main surface of the wiring board 9. The solder paste 14 is also applied to the conductive region 93 of the wiring board 19 exposed through the opening 420 in the busbar 4 and the opening 91 in the wiring board 9. In FIG. 33, the solder paste 14 is shaded. The plurality of MOSFETs 16, the plurality of conductive pieces 18 and the connectors 7a and 7b are then soldered with a reflow method to the regions where the solder paste 14 was applied. The above-described circuit structure 1 shown in FIGS. 1 and 2 is thereby completed. Given that the MOSFETs 26 and the conductive pieces 28 are covered by the molded resin 11, the MOSFETs 26 and the conductive pieces 28 can be prevented from dropping out when the MOSFETs 16 and other components are soldered with the reflow method.

Figure 34:
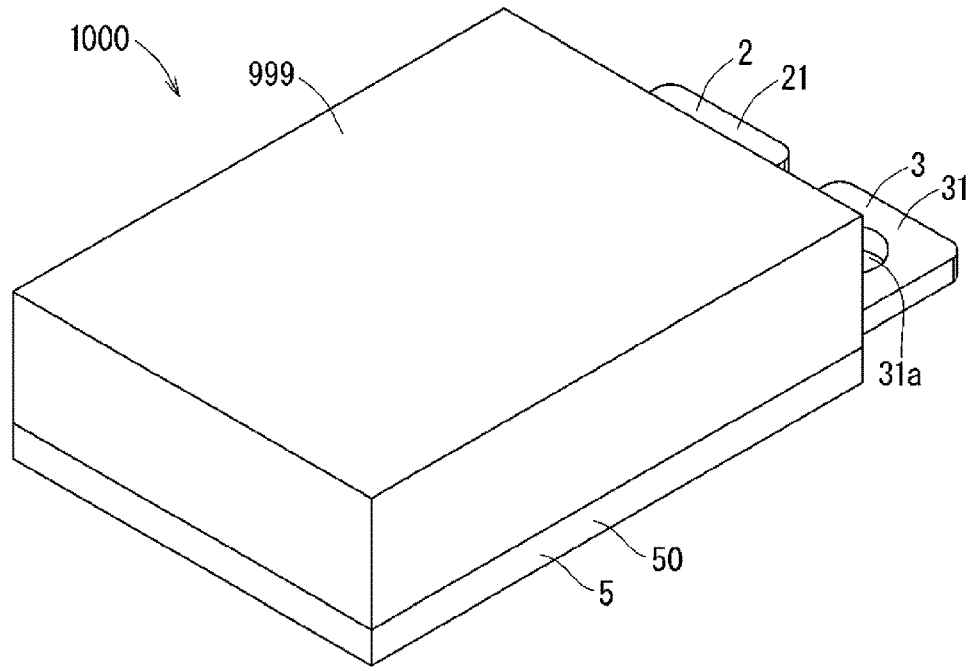
FIG. 34 is a schematic perspective view showing an example of an electrical junction box.

Thereafter, a control board that controls the MOSFETs 6 is attached to the circuit structure 1. A case 999 covering the wiring board 9, the plurality of MOSFETs 16, the plurality of connectors 7 and the plurality of conductive pieces 18 is then attached to the busbars 2 and 3. The electrical junction box 1000 is thereby completed, as shown in FIG. 34.

As described above, in the present embodiment, the drain terminals 63 electrically connected to the busbar 2 and the source terminals 62 electrically connected to the busbar 4 are both bonded to the wiring board 9 or the wiring board 19. On the other hand, due to the difference in coefficient of linear expansion of the busbars 2 and 4 with the insulating portion 51, the busbar 2, the busbar 4, and the insulating portion 51 could possibly deform due to changes in ambient temperature. In the present example, given that both the drain terminals 63 and the source terminals 62 are bonded to the wiring board 9 or the wiring board 19, the bonding portions of the drain terminals 63 and the source terminals 62 are less likely to be affected by deformation of the busbar 2, the busbar 4, and the insulating portion 51. Therefore, stress is less likely to occur in the bonding portions of the drain terminals 63 and the source terminals 62. As a result, the reliability of the bonding portions of the drain terminals 63 and the source terminals 62 can be improved.

Also, in the present embodiment, the conductive raised parts 202 protrude from the busbar 2 into the open holes 92 in the wiring board 9. The drain terminals 63 on the wiring board 9 can thus be easily electrically connected to the busbar 2, by electrically connecting the drain terminals 63 to the raised parts 202 protruding inside the open holes 92. In other words, the drain terminals 63 on the wiring board 9 can be easily electrically connected to the busbar 2, utilizing the raised parts 202. Also, since heat generated by the MOSFETs 6 on the wiring board 9 can be transferred to the busbar 2, local increases in temperature are less likely to occur. Similarly, given that the conductive raised parts 212 protrude from the busbar 2 into the open holes 92 in the wiring board 19, the drain terminals 63 on the wiring board 19 can be easily electrically connected to the busbar 2, utilizing the raised parts 212.

Also, in the present embodiment, given that the conductive raised parts 302 protrude from the busbar 3 into the open holes 92 in the wiring board 9, the drain terminals 63 on the wiring board 9 can be easily electrically connected to the busbar 3, utilizing the raised parts 302. Also, since heat generated by the MOSFETs 6 on the wiring board 9 can be transferred to the busbar 3, local increases in temperature are less likely to occur. Similarly, given that the conductive raised parts 312 protrude from the busbar 3 into the open holes 92 in the wiring board 19, the drain terminals 63 on the wiring board 19 can be easily electrically connected to the busbar 3, utilizing the raised parts 312.

Also, in the present embodiment, since the conductive raised parts 402 protrude from the busbar 4 into the open holes 92 in the wiring board 9, the source terminals 62 on the wiring board 9 can be easily electrically connected to the busbar 4, utilizing the raised parts 402. Also, since heat generated by the MOSFETs 6 on the wiring board 9 can be transferred to the busbar 4, local increases in temperature are less likely to occur. Similarly, given that the conductive raised parts 412 protrude from the busbar 4 into the open holes 92 in the wiring board 19, the source terminals 62 on the wiring board 19 can be easily electrically connected to the busbar 4, utilizing the raised parts 412.

Also, in the present embodiment, given that the raised parts 202 and 212 are constituted by part of the busbar 2, electrical resistance between the drain terminals 63 and the busbar 2 can be reduced. Also, given that the raised parts 302 and 312 are constituted by part of the busbar 3, electrical resistance between the drain terminals 63 and the busbar 3 can be reduced. Also, given that the raised parts 402 and 412 are constituted by part of the busbar 4, electrical resistance between the source terminals 62 and the busbar 4 can be reduced.

In the present embodiment, given that the drain terminals 63 on the busbar 2 are bonded to the raised parts 202 or the raised parts 212, as shown in FIG. 6, electrical resistance between the drain terminals 63 and the busbar 2 can be reduced. Also, given that the drain terminals 63 on the busbar 3 are bonded to the raised parts 302 or the raised parts 312, electrical resistance between the drain terminals 63 and the busbar 3 can be reduced.

Also, in the present embodiment, the conductive pieces 18 bonded to the extension regions 98 that extend from the lands 961 to which the source terminals 62 of the upper MOSFETs 16 are bonded and are located around the open holes 92 and to the end faces of the raised parts 402 protruding inside the open holes 92 are provided. Due to these conductive pieces 18, electrical resistance between the source terminals 62 and the busbar 4 can be reduced. Also, given that transfer of heat generated by the MOSFETs 16 to the busbar 4 is facilitated by the conductive pieces 18, local increases in temperature are less likely to occur.

Also, the conductive pieces 28 bonded to the extension regions 98 that extend from the lands 961 to which the source terminals 62 of the lower MOSFETs 26 are bonded and are located around the open holes 92 and to the end faces of the raised parts 412 protruding inside the open holes 92 are provided. Due to these conductive pieces 28, electrical resistance between the source terminals 62 and the busbar 4 can be reduced. Also, given that transfer of heat generated by the MOSFET 26 to the busbar 4 is facilitated by the conductive pieces 28, local increases in temperature are less likely to occur.

Also, in the present embodiment, the upper extension regions 98 surround the open holes 92, and the conductive pieces 18 cover the opening edges of the open holes 92. The bonding area of the conductive pieces 18 with the extension regions 98 and the raised parts 402 can thereby be increased. As a result, electrical resistance between the source terminals 62 and the busbar 4 can be further reduced.

Also, the lower extension regions 98 surround the open holes 92, and the conductive pieces 28 cover the opening edges of the open holes 92. The bonding area of the conductive pieces 28 with the extension regions 98 and the raised parts 412 can thereby be increased. As a result, electrical resistance between the source terminals 62 and the busbar 4 can be further reduced.

In the present embodiment, given that the MOSFETs 6 are located on both main surfaces of the busbars 2, 3 and 4, the plane size of the circuit structure 1 can be reduced.

Also, in the present embodiment, given that the heat dissipation member 10a is provided on the lower main surface 210 of the busbar 2, the allowable heat generation of the circuit structure 1 increases. Also, given that the heat dissipation member 10b is provided on the lower main surface 310 of the busbar 3, the allowable heat generation of the circuit structure 1 increases. Therefore, it becomes possible to mount a plurality of MOSFETs 6 at a high density, for example.

Also, in the present embodiment, given that the heat dissipation member 10a is provided on the lower main surface 210 of the busbar 2 while avoiding the region where the wiring board 19 is provided, the thickness of the circuit structure 1 can be suppressed while improving heat dissipation of the circuit structure 1. Similarly, given that the heat dissipation member 10b is provided on the lower main surface 310 of the busbar 3 while avoiding the region where the wiring board 19 is provided, the thickness of the circuit structure 1 can be suppressed while improving heat dissipation of the circuit structure 1

Also, in the present embodiment, given that the gate terminal 61 and the source terminals 62 of each MOSFET 16 are insulated from each other on the wiring board 9, the gate terminal 61 and the source terminals 62 can be appropriately insulated from each other, even if the interval between the gate terminal 61 and the source terminals 62 is small. Therefore, a narrow pitch package having a narrow terminal spacing can be employed as the package 60 of the MOSFETs 16. Similarly, given that the gate terminal 61 and the source terminals 62 of each MOSFET 26 are insulated from each other on the wiring board 19, the gate terminal 61 and the source terminals 62 can be appropriately insulated from each other, even if the interval between the gate terminal 61 and the source terminals 62 is small. Therefore, a narrow pitch package having a narrow terminal spacing can be employed as the package 60 of the MOSFETs 26.

Also, in the present embodiment, given that the extension regions 98 to which the conductive pieces 18 are bonded extend from both the lands 961 to which the source terminals 62 of the MOSFETs 16a are bonded and the lands 961 to which the source terminals 62 of the MOSFETs 16b are bonded and are located around the open holes 92c, the extension regions 98 can be shared by the MOSFETs 16a and 16b. Electrical resistance between the source terminals 62 of the MOSFETs 16a and the busbar 4 and electrical resistance between the source terminals 62 of the MOSFETs 16b and the busbar 4 can thereby be reduced with a simple configuration.

Other Examples of Circuit Structure

The structure of the circuit structure 1 is not limited to the above examples. For example, a configuration may be adopted in which either or both the raised parts 202 and 212 are constituted separately from the busbar 2, rather than being constituted by part of the busbar 2. In this case, either or both the raised parts 202 and 212 may be bonded by a conductive bonding material such as solder to the main surface of the busbar 2. Similarly, either or both the raised parts 302 and 312 may be constituted separately from the busbar 3. Also, either or both the raised parts 402 and 412 may be constituted separately from the busbar 4.

Also, the circuit structure 1 may not include the conductive pieces 18. In this case, the raised part 402 protruding inside each open hole 92 may be bonded to the extension region 98 around that open hole 92 by solder or the like. Also, the circuit structure 1 may not include the conductive pieces 28. In this case, the raised part 412 protruding inside each open hole 92 may be bonded to the extension region 98 around that open hole 92 by solder or the like.

Also, the circuit structure 1 may not include the heat dissipation members 10. Also, the MOSFETs 6 and the conductive pieces 8 may not be provided on one main surface of the busbars 2, 3 and 4.

To facilitate solder-bonding of the terminals and the like to the busbars 2, 3 and 4, to reduce contact resistance between the wiring members and the input terminal part 21, and to reduce contact resistance between the wiring members and the output terminal part 31, the busbars 2, 3 and 4 may have metal plating such as nickel plating on both main surfaces. In this case, the busbars 2, 3 and 4 may be copper plates whose surfaces have been metal plated.

Although the circuit structure 1 has been described in detail above, the foregoing description is illustrative in all respects, and the disclosure is not limited thereto. The various modifications described above can be applied in combination as long as there are no mutual inconsistencies. Also, it should be understood that numerous modifications not illustrated herein can be contemplated without departing from the scope of this disclosure.

The invention claimed is:

1. A circuit structure comprising:
   a first busbar;
   a second busbar;
   an insulating member including an insulating portion located between the first busbar and the second busbar;
   a first wiring board provided on one main surface of the first busbar, one main surface of the second busbar, and the insulating portion;
   a second wiring board provided on another main surface of the first busbar, another main surface of the second busbar, and the insulating portion;
   a first electronic component provided on the first wiring board; and
   a second electronic component provided on the second wiring board,
   wherein the first electronic component has:
   a first connection terminal electrically connected to the first busbar and bonded to the first wiring board; and
   a second connection terminal electrically connected to the second busbar and bonded to the first wiring board, and
   the second electronic component has:
   a third connection terminal electrically connected to the first busbar and bonded to the second wiring board; and
   a fourth connection terminal electrically connected to the second busbar and bonded to the second wiring board.

2. The circuit structure according to claim 1, wherein the first wiring board has a first open hole,
   the circuit structure comprises a conductive first raised part protruding from the first busbar into the first open hole, and
   the first connection terminal is electrically connected to the first raised part protruding inside the first open hole.

3. The circuit structure according to claim 2, wherein the first raised part is constituted by part of the first busbar.

4. The circuit structure according to claim 2, wherein the first connection terminal is bonded to the first raised part.

5. The circuit structure according to claim 1, wherein the first wiring board has a second open hole,
   the circuit structure comprises a conductive second raised part protruding from the second busbar into the second open hole,
   the second connection terminal is electrically connected to the second raised part protruding inside the second open hole.

6. The circuit structure according to claim 5, wherein the first wiring board has:
   a land to which the second connection terminal is bonded; and
   a conductive extension region extending from the land and surrounding the second open hole, and
   the circuit structure further comprises a conductive piece bonded to an end face of the second raised part and to the extension region, wherein the end face protrudes from the second open hole.

7. The circuit structure according to claim 1, further comprising:
   a heat dissipation member provided on the other main surface of the first busbar while avoiding a region where the second wiring board is provided.

8. The circuit structure according to claim 3, wherein the first connection terminal is bonded to the first raised part.

9. The circuit structure according to claim 2, wherein the first wiring board has a second open hole,
   the circuit structure comprises a conductive second raised part protruding from the second busbar into the second open hole,
   the second connection terminal is electrically connected to the second raised part protruding inside the second open hole.

10. The circuit structure according to claim 3, wherein the first wiring board has a second open hole,
    the circuit structure comprises a conductive second raised part protruding from the second busbar into the second open hole,
    the second connection terminal is electrically connected to the second raised part protruding inside the second open hole.

11. The circuit structure according to claim 4, wherein the first wiring board has a second open hole,
    the circuit structure comprises a conductive second raised part protruding from the second busbar into the second open hole,
    the second connection terminal is electrically connected to the second raised part protruding inside the second open hole.

12. The circuit structure according to claim 2, further comprising:
    a heat dissipation member provided on the other main surface of the first busbar while avoiding a region where the second wiring board is provided.

13. The circuit structure according to claim 3, further comprising:
    a heat dissipation member provided on the other main surface of the first busbar while avoiding a region where the second wiring board is provided.

14. The circuit structure according to claim 4, further comprising:
    a heat dissipation member provided on the other main surface of the first busbar while avoiding a region where the second wiring board is provided.

15. The circuit structure according to claim 5, further comprising:
    a heat dissipation member provided on the other main surface of the first busbar while avoiding a region where the second wiring board is provided.

16. The circuit structure according to claim 6, further comprising:
    a heat dissipation member provided on the other main surface of the first busbar while avoiding a region where the second wiring board is provided.

* * * * *